(12) United States Patent
Ishikawa

(10) Patent No.: US 6,914,665 B2
(45) Date of Patent: Jul. 5, 2005

(54) EXPOSURE APPARATUS, EXPOSURE METHOD, AND DEVICE MANUFACTURING METHOD

(75) Inventor: Jun Ishikawa, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/634,958

(22) Filed: Aug. 6, 2003

(65) Prior Publication Data

US 2004/0090606 A1 May 13, 2004

Related U.S. Application Data

(63) Continuation of application No. PCT/JP02/00974, filed on Feb. 6, 2002.

(30) Foreign Application Priority Data

Feb. 6, 2001 (JP) ........................................ 2001-030112

(51) Int. Cl.⁷ .......................... G03B 27/42; G03B 27/54
(52) U.S. Cl. .......................................... 355/53; 355/67
(58) Field of Search .............................. 355/52, 53, 55, 355/67–71; 356/399–401; 250/548

(56) References Cited

U.S. PATENT DOCUMENTS

| | | | |
|---|---|---|---|
| 4,326,800 A | 4/1982 | Fitts | |
| 4,490,039 A | 12/1984 | Bruckler et al. | |
| 4,932,781 A | 6/1990 | Kuwayama | |
| 5,233,174 A | 8/1993 | Zmek | |
| 5,493,391 A | 2/1996 | Neal et al. | |
| 5,539,718 A | 7/1996 | Hoshi et al. | |
| 5,610,897 A | 3/1997 | Yamamoto et al. | |
| 5,760,879 A | 6/1998 | Shinonaga et al. | |
| 5,828,455 A | 10/1998 | Smith et al. | |
| 5,864,381 A | 1/1999 | Neal et al. | |
| 5,892,573 A | 4/1999 | Takahashi et al. | ............ 355/69 |
| 5,898,501 A | 4/1999 | Suzuki et al. | |
| 5,912,731 A | 6/1999 | DeLong et al. | |

(Continued)

FOREIGN PATENT DOCUMENTS

| | | |
|---|---|---|
| EP | 1 079 223 | 2/2001 |
| JP | 5-45889 | 2/1993 |
| JP | 10-289865 | 10/1998 |
| JP | 2000-195782 | 7/2000 |
| WO | WO 00/55890 | 9/2000 |

OTHER PUBLICATIONS

W. Freitag, et al., Jr, pp. VIII–XII, "Wavefront Analysis of Photolithographic Lenses", Jan. 1991.
T. Noguchi, et al., Publ. Natl. Astron. Obs. Japan, vol. 1, pp. 49–55, "Active Optics Experiments. I.", 1989.

*Primary Examiner*—Henry Hung Nguyen
(74) *Attorney, Agent, or Firm*—Oblon, Spivak, McClelland, Maier & Neustadt, P.C.

(57) ABSTRACT

A fiducial plate on which at least one pinhole shaped pattern is formed is fixed on a mask stage, which moves holding a mask. Therefore, for example, wavefront aberration of a projection optical system can be measured without using any special kind of masks for measurement, by setting a wavefront measurement instrument of the attaching type to a substrate stage, illuminating the fiducial plate with an illumination system, and receiving spherical waves generated at the pinhole shaped pattern via projection optical system with the wavefront measurement instrument. Accordingly, the wavefront aberration of the projection optical system can be measured easily, at a desired timing, which allows sufficient quality control to be performed on the projection optical system. As a consequence, the pattern of the mask can be accurately onto the substrate, using the projection optical system on which sufficient quality control is performed.

25 Claims, 8 Drawing Sheets

U.S. PATENT DOCUMENTS

| | | | |
|---|---|---|---|
| 5,936,720 A | 8/1999 | Neal et al. | |
| 5,978,085 A | 11/1999 | Smith et al. | |
| 6,052,180 A | 4/2000 | Neal et al. | |
| 6,118,535 A * | 9/2000 | Goldberg et al. | 356/521 |
| 6,130,419 A | 10/2000 | Neal | |
| 6,184,974 B1 | 2/2001 | Neal et al. | |
| 6,256,086 B1 * | 7/2001 | Sumiyoshi | 355/55 |
| 6,278,514 B1 * | 8/2001 | Ohsaki | 355/55 |
| 6,312,373 B1 * | 11/2001 | Ichihara | 356/515 |
| 6,360,012 B1 | 3/2002 | Kreuzer | |
| 6,492,649 B1 | 12/2002 | Nei et al. | 250/548 |
| 6,549,270 B1 * | 4/2003 | Ota | 355/55 |
| 6,633,362 B2 * | 10/2003 | Murakami et al. | 355/53 |
| 2002/0027648 A1 * | 3/2002 | Van Der Laan et al. | 355/71 |
| 2002/0041377 A1 | 4/2002 | Haglwara et al. | 356/399 |
| 2004/0027573 A1 | 2/2004 | Takahashi | 356/400 |

* cited by examiner

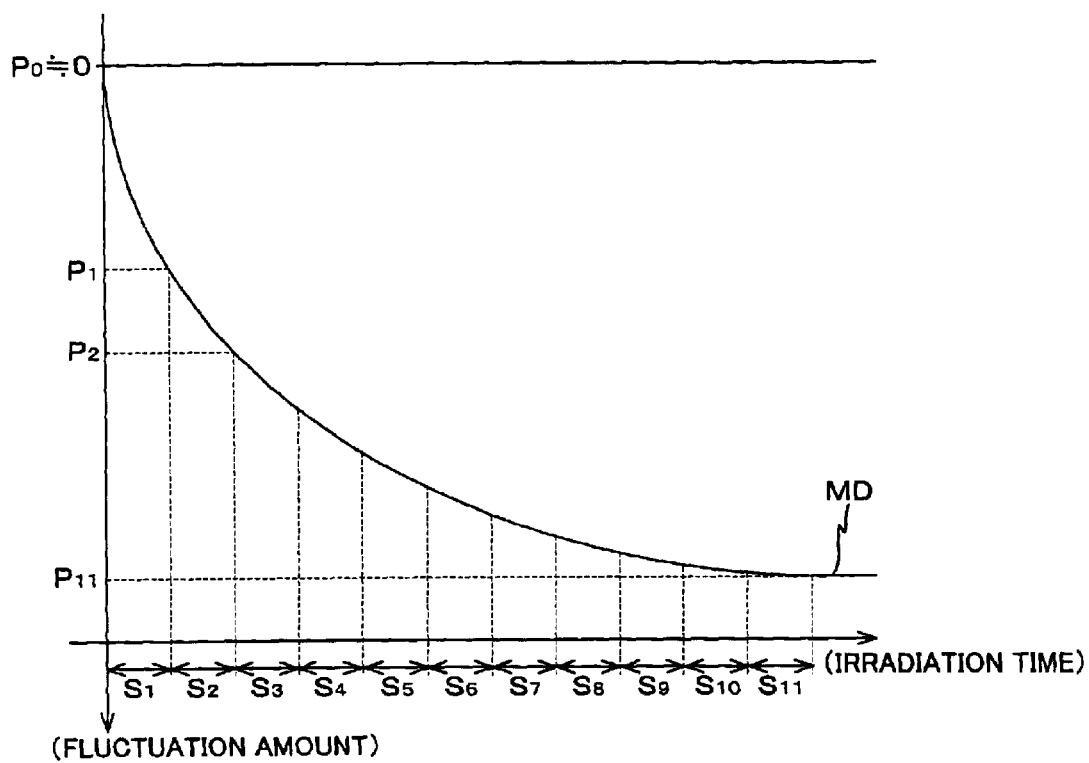
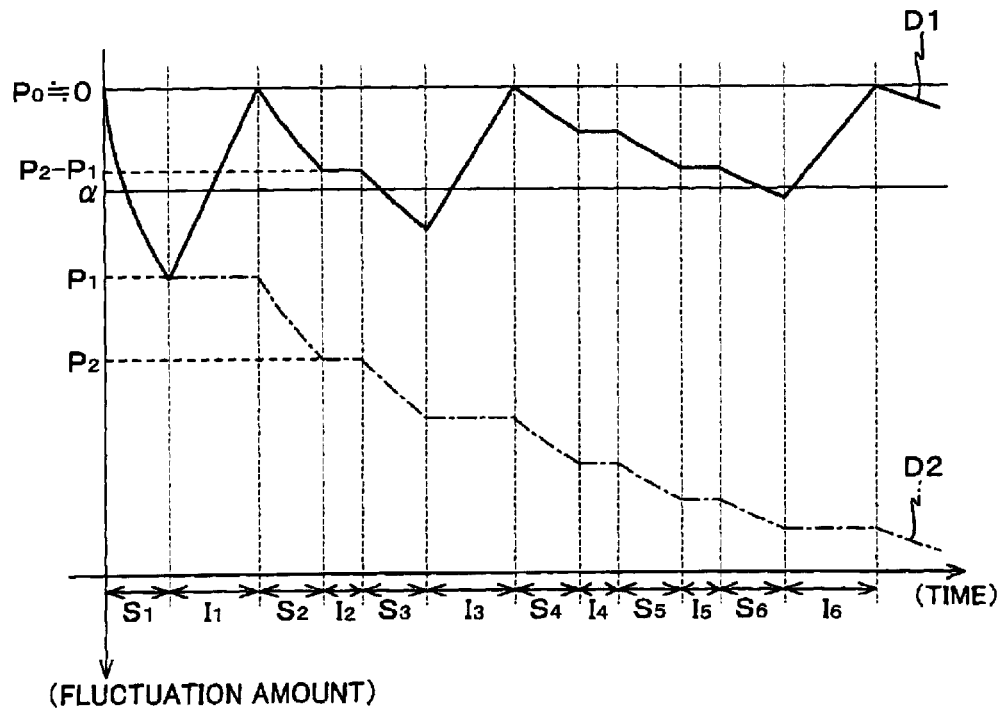

EXPOSURE APPARATUS, EXPOSURE METHOD, AND DEVICE MANUFACTURING METHOD

CROSS-REFERENCE TO RELATED APPLICATIONS

This is a continuation of International Application PCT/JP02/00974, with an international filing date of Feb. 6, 2002, the entire content of which being hereby incorporated herein by reference, which was not published in English.

BACKGROUND OF THE INVENTION

1. Field of the Invention

The present invention relates to exposure apparatus, exposure methods, and device manufacturing methods, and more particularly, to an exposure apparatus and an exposure method used in a lithographic process for manufacturing electronic devices such as a semiconductor device as in an LSI, a liquid crystal display device, a pick-up device as in a CCD, or a thin-film magnetic head, when transferring a pattern formed on a mask or a reticle (hereinafter generally referred to as a "reticle") onto a substrate such as a wafer, and a device manufacturing method using the exposure apparatus and exposure method.

2. Description of the Related Art

Circuit patterns are becoming finer according to higher integration in devices such as semiconductors, and in order to cope with such a situation, requirements for an improvement in the resolution of exposure apparatus are pressing, which requires exposure wavelength in a shorter range. Recently, as a successor to the exposure apparatus using the KrF excimer laser (output wavelength: 248 nm) as its light source, an exposure apparatus that uses an Argon Fluoride excimer laser (ArF excimer laser) having an output wavelength of 193 nm as its light source has been put to practical use. With the exposure apparatus using the ArF excimer laser as its light source, electronic devices (micro devices) that have fine patterns with the practical minimum line width (device rule) from 0.18 $\mu$m up to 0.10 $\mu$m can be mass-produced.

In an exposure apparatus, other than resolution, overlay accuracy of a reticle pattern on a pattern already formed on a shot area is also significant. In order to maintain favorable overlay accuracy, aberration has to be suppressed in the projection optical system used as much as possible. To control the aberration, conventionally, a measurement technique was employed that performed the following operations: exposing a predetermined measurement pattern on a reticle onto a substrate via a projection optical system, developing the substrate, measuring line width, positional deviation, and the like of a resist image formed on the substrate using equipment such as a scanning electron microscope (SEM), and obtaining the aberration of the optical system based on the measurement results.

However, when it comes to measuring fine patterns of 0.13 $\mu$m and under, the measurement technique having the process of using equipment such as the above SEM has its limits. This is because of reasons such as: errors may occur in reticle manufacturing such as fabricating errors of measurement patterns, errors may be caused in the process of resist coating and development of the substrate, or errors and deterioration of measurement reproducibility may occur when equipment such as the SEM is used. Therefore, recently, the trend is moving toward securing the performance of the projection optical by wavefront aberration. Since measurement by wavefront aberration does not require any process in between, performance of the projection optical system can be guaranteed at a higher precision.

Such methods of securing the performance of the projection optical system by wavefront aberration include a method of measuring the wavefront aberration of the projection optical system using an exclusive wavefront measurement unit that uses interferometers or the like in the adjustment process of the projection optical system itself, and adjusting the aberration precisely, based on the measurement results. In this method, however, when the environment changes in between a state where the projection optical system stands alone and a state where the projection optical system has been incorporated into the main body of the exposure apparatus, or when an accident occurs during the incorporation into the main body of the exposure apparatus, quality assurance on shipment is insufficient, and in some cases, not possible. For such reasons, mainly from the viewpoint of quality assurance, which is performed by measuring the wavefront aberration right before shipment and adjusting the aberration of the projection optical system based on the measurement results, proposals are recently made on a wavefront measurement unit that can measure the wavefront aberration even after when the projection optical system is built into the exposure apparatus, such as a compact wavefront measurement unit (wavefront measurement instrument), which can be provided inside the exposure apparatus by attaching it to the substrate stage or exchanging it with the substrate stage.

However, as is described so far, since the main purpose of the above conventional wavefront measurement instrument was to measure the wavefront aberration of the projection optical system from the viewpoint of quality assurance on shipment, the above conventional wavefront measurement instrument was not designed for measurement of the wavefront aberration of the projection optical system after shipment. Therefore, the wavefront measurement instrument was not attached to the exposure apparatus after shipment, and the exposure apparatus itself did not have a suitable configuration to perform wavefront measurement frequently. This caused difficulty in performing sufficient quality control on the projection optical system during normal usage of the exposure apparatus.

SUMMARY OF THE INVENTION

The present invention was made under such circumstances, and has as its first object to provide an exposure apparatus that can perform sufficient quality control of the projection optical system.

The second object of the present invention is to provide an exposure method in which a pattern on a mask can be precisely transferred onto each substrate layer using a projection optical system that has good image forming characteristics.

In addition, the third object of the present invention is to provide a device manufacturing method that can improve productivity of microdevices.

According to the first aspect of the present invention, there is provided an exposure apparatus that illuminates a mask on which a pattern is formed with an illumination light from an illumination system and transfers the pattern onto a substrate via a projection optical system, the exposure apparatus comprising: a mask stage that moves holding the mask; a pattern plate mounted on the mask stage, on which at least one pinhole shaped aperture pattern is formed; and a substrate stage that moves holding the substrate.

With the exposure apparatus, a pattern plate on which at least one pinhole shaped aperture pattern is formed is mounted on the mask stage that moves holding the mask. Therefore, for example, by attaching a wavefront measurement instrument of the attaching type referred to earlier to the substrate stage and illuminating the pattern plate with exposure illumination light from the illumination system, the spherical waves generated from the aperture pattern can be received with the wavefront measurement instrument via the projection optical system, and the wavefront aberration of the projection optical system can be measured. In this case, a special mask (reticle) for measurement does not have to be mounted on the mask stage. Accordingly, the wavefront aberration measurement of the projection optical system can be performed easily at a desired timing, which allows sufficient quality control to be performed on the projection optical system, which in turn allows the pattern of the mask to be transferred with good accuracy on the substrate using the projection optical system on which sufficient quality control has been performed.

In this case, the exposure apparatus can further comprise: a wavefront measurement instrument mounted on the substrate stage; and a first control unit that performs wavefront measurement to measure wavefront aberration of the projection optical system using the wavefront measurement instrument, by adjusting at least one of the mask stage and the substrate stage so that the wavefront measurement instrument is positioned at a projection position of the aperture pattern by the projection optical system, and irradiating the aperture pattern on the pattern plate with illumination light from the illumination system. In such a case, the first control unit adjusts at least one of the mask stage and the substrate stage so that the wavefront measurement instrument is positioned at the projection position of the aperture pattern by the projection optical system, irradiates the exposure illumination light from the illumination system on the aperture pattern of the pattern plate, and measures the wavefront aberration of the projection optical system using the wavefront measurement instrument. Therefore, the wavefront aberration measurement of the projection optical system can be performed automatically at the desired timing. In this case, the operation to attach the wavefront measurement instrument onto the substrate stage will not be required.

In this case, the exposure apparatus can further comprise: a correction mechanism that corrects wavefront aberration of the projection optical system; and a second control unit that performs wavefront correction by controlling the correction mechanism to make a wavefront aberration state of the projection optical system near an ideal state, based on a result of the wavefront aberration measurement.

In this case, when the pattern is sequentially transferred onto a plurality of substrates via the projection optical system, the first control unit can perform the wavefront measurement each time before exposure of a predetermined number of substrates begins, and the second control unit can perform the wavefront correction each time when the wavefront measurement is performed.

"A predetermined number (of substrates)" in this case, includes only one substrate. Accordingly, "each time before exposure of a predetermined number of substrates begins" includes the meaning of before exposure of each wafer begins. In this description, the term "a predetermined number (of substrates)" is used in the above meaning.

With the exposure apparatus in the present invention, when the pattern is sequentially transferred onto a plurality of substrates via the projection optical system, the first control unit can perform the wavefront measurement each time before exposure of a predetermined number of substrates begins, and the exposure apparatus can further comprise: a judgment unit that judges whether a fluctuation amount of wavefront aberration from a previous measurement exceeds a predetermined value, each time the wavefront measurement is performed, and the second control unit can perform the wavefront correction when the judgment unit judges that the fluctuation amount exceeds a predetermined value.

With the exposure apparatus in the present invention, when the pattern is sequentially transferred onto a plurality of divided areas on a plurality of substrates via the projection optical system, the first control unit can perform the wavefront measurement each time before exposure of a predetermined number of substrates begins, and the second control unit can predict a fluctuation amount of wavefront aberration that occurs when exposing the plurality of divided areas on the plurality of substrates in the next exposure based on a result of the wavefront measurement each time the wavefront measurement is performed, and can perform the wavefront correction based on results of the prediction each time before exposure of a predetermined number of divided areas among the plurality of divided areas on each substrate begins.

"A predetermined number (of divided areas)" in this case, includes only one divided area. Accordingly, "each time before exposure of a predetermined number of divided areas begins" includes the meaning of before exposure of each divided area begins. The term "a predetermined number (of divided areas)" is used in the above meaning, in this description.

With the exposure apparatus in the present invention, when the pattern is sequentially transferred onto a plurality of divided areas on a plurality of substrates via the projection optical system, the first control unit can perform the wavefront measurement each time before exposure of a predetermined number of substrates begins, and the exposure apparatus can further comprise: a judgment unit that predicts a fluctuation amount of wavefront aberration that occurs when exposing the plurality of divided areas on the plurality of substrates in the next exposure based on a result of the wavefront measurement each time the wavefront measurement is performed, and judges whether a fluctuation amount of wavefront aberration from before exposure previously performed on divided areas a predetermined numbers earlier begins has exceeded a predetermined value or not, each time before exposure of the predetermined number of divided areas among the plurality of divided areas on each substrate begins, and the second control unit can perform the wavefront correction based on a result of the prediction before exposure of the next predetermined number of divided areas begins, when the judgment unit judges that the fluctuation amount has exceeded a predetermined value.

According to the second aspect of the present invention, there is provided a first exposure method in which a mask where a pattern is formed is illuminated with an illumination light and the pattern is sequentially transferred onto a plurality of substrates via a projection optical system, the exposure method comprising: a wavefront aberration measurement process in which wavefront aberration of the projection optical system is measured each time before exposure of a predetermined number of substrates begins; and a wavefront aberration correction process in which correction is performed that corrects wavefront aberration of the projection optical system based on a result of the wavefront aberration measurement.

With the exposure method, when the mask on which the pattern is formed is illuminated with the exposure illumination light and the pattern is sequentially transferred onto a plurality of substrates via the projection optical system, the wavefront aberration of the projection optical system is measured each time before exposure of the predetermined number of substrates begins, and based on the measurement results, the wavefront aberration of the projection optical system is corrected. That is, the wavefront aberration of the projection optical system is measured each time before exposure of the predetermined number of substrates begins, and based on the measurement results of the wavefront aberration, the state of the wavefront aberration of the projection optical system is corrected to near the ideal state. Therefore, the image forming characteristics of the projection optical system can be favorably maintained. And, since exposure is performed using the projection optical system which image forming characteristics are favorably maintained, the pattern on the mask can be transferred onto each substrate with good accuracy.

The interval between the wavefront measurements depends on the setting of the above predetermined number of substrates. That is, the smaller the predetermined number of substrates is, the more favorable the image forming characteristics of the projection optical system is maintained, therefore, exposure with more accuracy can be performed, while the greater the predetermined number of the substrates is, the more the throughput improves. Accordingly, the predetermined number of substrates may be determined, according to the accuracy required.

In this case, procedure in the wavefront aberration correction process can be performed each time the wavefront aberration measurement is performed.

With the first exposure method in the present invention, the method can further comprise: a prediction process in which an amount of fluctuation of wavefront aberration occurring when exposing a plurality of divided areas on the predetermined number of substrates in the next exposure is predicted, based on a result of the wavefront measurement each time the wavefront measurement is performed; wherein in the wavefront aberration correction process, the wavefront aberration correction can be performed based on a result of the prediction, each time before exposure of a predetermined number of divided areas on each substrate begins.

With the first exposure method in the present invention, the method can further comprise: a judgment process in which a fluctuation amount of wavefront aberration from the previous wavefront measurement is judged whether it exceeds a predetermined value or not, each time the wavefront measurement is performed; wherein in the wavefront aberration correction process, the wavefront correction can be performed when it is judged that the fluctuation amount has exceeded a predetermined value.

Besides what is described above, with the first exposure method in the present invention, the method can further comprise: a prediction process in which a fluctuation amount of wavefront aberration occurring when exposing a plurality of divided areas on the predetermined number of substrates in the next exposure is predicted, based on a result of the wavefront measurement each time the wavefront measurement is performed; and a judgment process in which a fluctuation amount of wavefront aberration from before exposure performed previously on divided areas a predetermined numbers earlier begins is judged whether it exceeds a predetermined value or not, each time before exposure of the predetermined number of divided areas on each substrate begins, wherein in the wavefront aberration correction process, the wavefront correction is performed based on a result of the prediction before exposure of the next predetermined number of divided areas begins, when the fluctuation amount is judged to be exceeding a predetermined value.

According to the third aspect of the present invention, there is provided a second exposure method in which a mask where a pattern is formed is illuminated with an illumination light and the pattern is sequentially transferred onto a plurality of substrates via a projection optical system, the exposure method comprising: a wavefront aberration measurement process in which wavefront aberration of the projection optical system is measured each time before exposure of a predetermined number of substrates begins; a prediction process in which an amount of fluctuation of wavefront aberration occurring when exposing a plurality of divided areas on the predetermined number of substrates in the next exposure is predicted, based on a result of the wavefront measurement each time the wavefront measurement is performed; and a wavefront aberration correction process in which wavefront correction is performed that corrects the wavefront aberration based on a result of the prediction.

With this exposure method, when the mask on which the pattern is formed is illuminated with the exposure illumination light and the pattern is sequentially transferred onto a plurality of substrates via the projection optical system, the wavefront aberration of the projection optical system is measured each time before exposure of the predetermined number of substrates begins, and based on the wavefront measurement results, the fluctuation amount of the wavefront aberration, which occurs when exposing a plurality of divided areas on the predetermined number of substrates in the next exposure, is predicted. And, based on the prediction results, the wavefront correction to correct the wavefront aberration is performed. That is, each time before exposure of the predetermined number of substrates begins, the wavefront aberration of the projection optical system is measured, and based on the measurement results, the fluctuation amount of the wavefront aberration, which occurs when exposing a plurality of divided areas on the predetermined number of substrates in the next exposure, is predicted. And, based on the prediction results, the state of the wavefront aberration of the projection optical system is corrected so that it nears the ideal state, which makes it possible to maintain a favorable image forming characteristics in the projection optical system. Then, since exposure is performed using the projection optical system which image forming characteristics is favorably maintained, the pattern of the mask can be transferred with good accuracy on each substrate.

In this case, the method can further comprise: a judgment process in which a fluctuation amount of wavefront aberration is judged whether it exceeds a predetermined value or not from the previous wavefront measurement each time the wavefront measurement is performed; and in the wavefront aberration correction process, the wavefront correction can be performed when it is judged that the fluctuation amount has exceeded a predetermined value.

With the second exposure method in the present invention, the predetermined number of substrates is in plurals, and in the prediction process, an amount of fluctuation of wavefront aberration that occurs when exposing a plurality of divided areas on the plurality of substrates can be predicted.

In addition, in a lithographic process, by performing exposure using the exposure apparatus in the present invention, the pattern can be formed with good accuracy on the substrate, allowing production of microdevices with higher integration with good yield. Similarly, in the lithographic process, by employing one of the first and the second exposure methods in the present invention, the pattern can be formed with good accuracy on the substrate, allowing production of microdevices with higher integration with good yield. Accordingly, in the present invention, furthermore from another aspect, there is provided a device manufacturing method using the exposure apparatus in the present invention or one of the first and second exposure methods in the present invention.

BRIEF DESCRIPTION OF THE DRAWINGS

FIG. 5A is a map data that shows a relation between irradiation time and an amount of fluctuation of wavefront aberration, and FIG. 5B is a line chart that shows an example of a wavefront correction of a projection optical system using the map data in FIG. 5A;

DESCRIPTION OF THE PREFERRED EMBODIMENTS

Referring to FIGS. 1 to 5, an embodiment of the present invention is described below.

Figure 1:
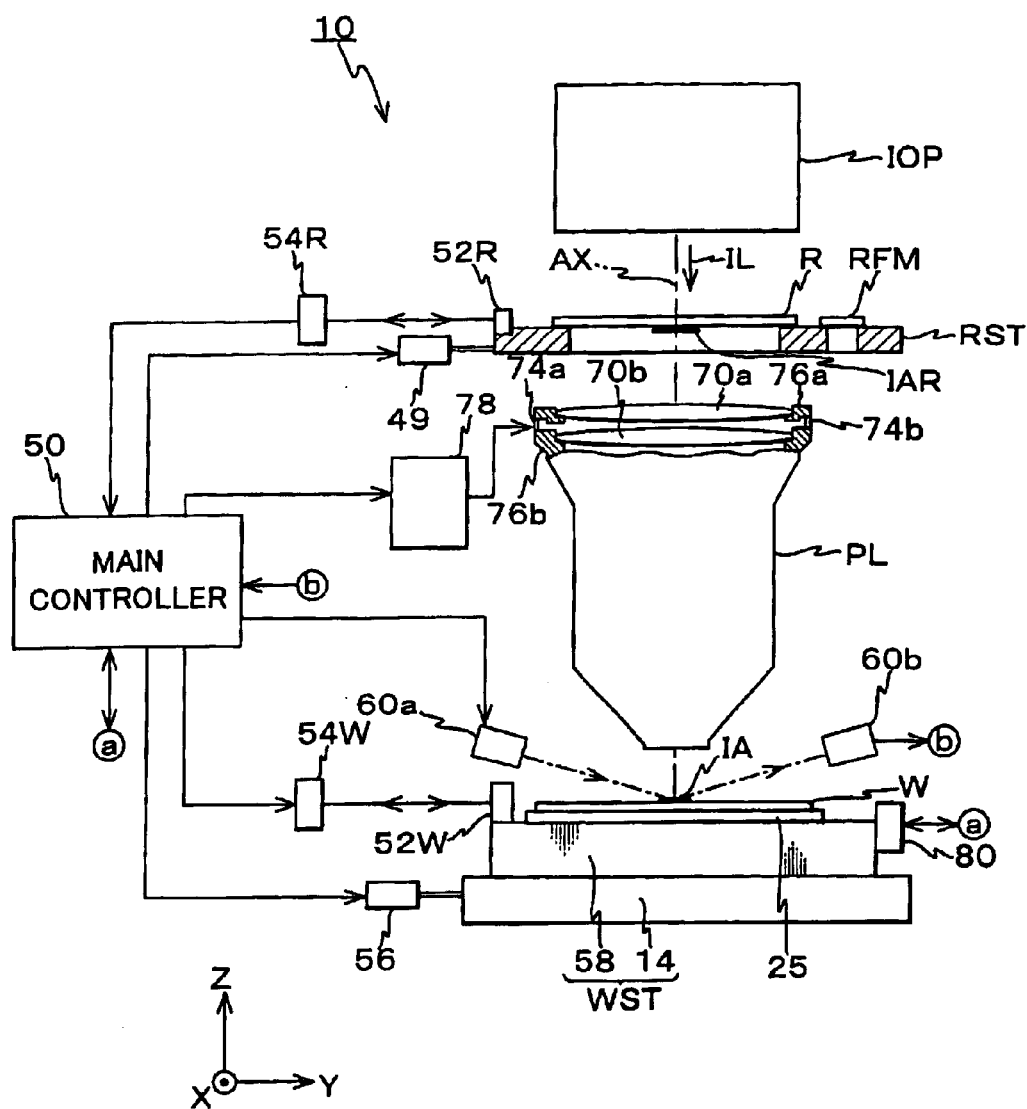
FIG. 1 is a view of the entire configuration of an exposure apparatus related to an embodiment in the present invention.

FIG. 1 shows an entire configuration of an exposure apparatus 10 related to the embodiment. Exposure apparatus 10 is a scanning exposure apparatus, based on a step-and-scan method.

Exposure apparatus 10 comprises: an illumination system IOP made up of a light source (not shown) and an illumination optical system; a reticle stage RST that holds a reticle R serving as a mask, which is illuminated with an illumination light for exposure (hereinafter simply referred to as "illumination light") IL emitted from illumination system IOP; a projection optical system PL that projects illumination light IL outgoing from reticle R onto a wafer W serving as a substrate; a wafer stage WST that holds wafer W and serves as a substrate stage; a control system for these parts, and the like.

Illumination system IOP is structured including a light source, an illuminance uniformity optical system including an optical integrator, a relay lens, a variable ND filter, a reticle blind, and a dichroic mirror (all of which are not shown), as is disclosed in, for example, Japanese Patent Application Laid-open No. 10-112433, Japanese Patent Application Laid-open No. 06-349701 and its corresponding U.S. Pat. No. 5,534,970. As the optical integrator, parts such as a fly-eye lens, a rod integrator (an internal reflection type integrator), or a diffraction optical element can be used. As long as the national laws in designated states or elected states, to which this international application is applied, permit, the disclosure of U.S. Patent cited above is fully incorporated herein by reference.

In illumination system IOP, illumination light IL illuminates a rectangular slit-shaped illumination area (set by the reticle blind inside IOP) on reticle R where circuit patterns are formed with a substantially uniform illuminance. As illumination light IL, near ultraviolet light (far ultraviolet light) such as a KrF excimer laser beam (wavelength: 248 nm) or an ArF excimer laser beam (wavelength: 193 nm), or vacuum ultraviolet light such as an $F_2$ laser beam (wavelength: 157 nm) is to be used. An emission line (such as a g-line or an i-line) in an ultraviolet region emitted from an ultra-high pressure mercury lamp can also be used as illumination light IL.

Reticle R is mounted on reticle stage RST, and is held via suction such as vacuum chucking. Reticle stage RST is finely driven within a horizontal plane (an XY plane) by a reticle stage drive section 49, as well as scanned within a range of predetermined strokes in a scanning direction (in this case, in a Y-axis direction, which is the lateral direction on the page surface of FIG. 1). The position of reticle stage RST is detected at all times with an external laser interferometer 54R via a movable mirror 52R, which is fixed on reticle stage RST, at a resolution of, for example, 0.5 to 1 nm. Although, mirror 52R and reticle interferometer 54R are shown representatively in FIG. 1, in actual, a movable mirror that has a reflection surface perpendicular to the Y-axis direction and a movable mirror that has a reflection surface perpendicular to the X-axis direction are provided on reticle stage RST, and corresponding to these movable mirrors, a reticle Y interferometer and a reticle X interferometer are provided. Incidentally, the end surfaces of reticle stage RST may be polished to make the reflection surfaces (corresponding to the reflection surfaces of movable mirror 52R). In addition, instead of the reflection surface extending in the X-axis direction used for position detection of reticle stage RST in the scanning direction (the Y-axis direction in the embodiment), at least one corner cube mirror may be used. Of the interferometers, one of reticle Y interferometer and reticle X interferometer is a double-axis interferometer that has two length measurement axes, for example, reticle Y interferometer, and based on measurement values of reticle Y interferometer, a Y position of reticle stage RST can be measured, as well as rotation in a θz direction. And, measurement values of laser interferometer 54R are to be supplied to a main controller 50.

In addition, on reticle stage RST, a reticle fiducial mark plate (hereinafter referred to as "reticle fiducial plate") RFM, which serves as a pattern plate on which a pinhole opening (aperture pattern) serving as a pinhole-shaped pattern is formed in the center, is arranged in the vicinity of reticle R. Reticle fiducial plate RFM has a glass plate and a light shielding film, which is formed on the lower surface of the glass plate in FIG. 1 by evaporation coating of metal such as chromium, and on the light shielding film, a plurality of pin-hole-shaped aperture patterns are formed arranged in a line in the X-axis direction.

The material used to make reticle R and reticle fiducial plate RFM depends on the light source to be used. That is, when the $F_2$ laser is used, they need to be made of fluorite, synthetic quartz doped with fluorine, or some other type of fluoride crystal. However, when the KrF excimer laser or the ArF excimer laser is used as the light source, besides each of the materials referred to above, synthetic quartz can be used.

Projection optical system PL is, for example, a double telecentric reduction system, and is made up of a plurality of lens elements 70a, 70b, and so forth that has a common optical axis in a Z-axis direction. In addition, as projection optical system PL, a system that has a projection magnification β such as ¼, ⅕, or ⅙ is used. Therefore, when illumination area IAR on reticle R is illuminated with illumination light IL as is previously described, a reduced image (a partially inverted image) of the pattern drawn on reticle R in the illumination area is formed via projection optical system PL on a slit-shaped exposure area IA on wafer W, which surface is coated with a resist (photosensitive agent), at the projection magnification β. Exposure area IA on wafer W is conjugate with the above illumination area.

In the embodiment, among the above plurality of lens elements, a plurality of lens elements including lens element 70a, which is arranged closest to reticle R, is arranged independently drivable. For example, lens element 70a is supported by a ring-shaped support member 76a, which is supported at three points with expandable drive elements such as piezo elements 74a, 74b, and 74c (drive element 74c in the depth of the page surface is not shown) and is connected with a barrel portion 76b. And, with the above piezo elements 74a, 74b, and 74c, lens element 70a can be moved feely in the periphery at the three points, in a direction along an optical axis AX of projection optical system PL. That is, lens element 70a can be moved in parallel along optical axis AX according to the amount of displacement of the three drive elements 74a, 74b, and 74c, as well as be inclined at random with respect to a plane perpendicular to optical axis AX. Other drivable lens elements are also structured finely drivable along the direction of optical axis AX and in a direction of inclination, via a drive mechanism similar to that of lens element 70a. In this case, an image forming characteristics correction controller 78 controls the voltage applied to the drive elements driving the lens elements such as the above lens element 70a, based on instructions from main controller 50, consequently controlling the amount of displacement of the drive element. By driving the lens elements 70a or the like, for example, Seidel's five aberrations (distortion, astigmatism, coma, spherical aberration, and curvature of field (focus)) can be adjusted. That is, in the embodiment, parts such as drive elements 74a, 74b, and 74c that drive the drivable lens elements such as lens element 70a, and image forming characteristics correction controller 78 that controls these parts make up a correction mechanism.

When the KrF excimer laser beam or the ArF excimer laser beam is used as illumination light IL, materials such as synthetic quartz or fluorite can be used for each lens element making up projection optical system PL, however, when the $F_2$ laser beam is used, the material used for parts such as the lenses in projection optical system PL has to be only fluoride crystal, such as fluorite.

Wafer stage WST comprises: an XY stage 14 that moves freely within the XY plane by linear motors (not shown); and an Z tilt stage 58 mounted on XY stage 14, and the like. A wafer holder 25 that is substantially circular is mounted on Z tilt stage 58, and holds wafer W by vacuum chucking.

In addition, the Z tilt stage 58 is arranged on XY stage 14 with the position in the XY direction set, as well as is structured movable along the Z-axis direction and inclinable with respect to the XY plane by a drive system (not shown). This allows a surface position of wafer W (position in the Z-axis direction and inclination with respect to the XY plane) held on Z tilt stage 58 to be set to a desired state.

Furthermore, a movable mirror 52W is fixed on Z tilt stage 58, and the position of Z tilt stage 58 within the XY plane is measured with an external laser interferometer 54W. The positional information measured with laser interferometer 54W is sent to main controller 50. Although, mirror 52W and laser interferometer 54W are shown representatively in FIG. 1, in actual, an X movable mirror that has a reflection surface perpendicular to the X-axis direction and a Y movable mirror that has a reflection surface perpendicular to the Y-axis direction are provided, and corresponding to these movable mirrors, an X laser interferometer that measures the X direction position and a Y laser interferometer that measures the Y direction position are provided. Incidentally, the end surfaces of Z tilt stage 58 may be polished to make the reflection surfaces (corresponding to the reflection surfaces of movable mirror 52W). In addition, X laser interferometer and Y laser interferometer are multiple-axis interferometers that have multiple length measurement axes, and other than the X, Y positions of Z tilt stage 58, rotation (yawing (θz rotation, which is rotation around the Z-axis), pitching (θx rotation, which is rotation around the X-axis), and rolling (θy rotation, which is rotation around the Y-axis)) can also be measured with the interferometers. Accordingly, in the following description, laser interferometer 54W is to measure the position of Z tilt stage 58 in directions of five degrees of freedom, in the X, Y, θz, θy, and θx directions. In addition, the multiple-axis interferometers may detect positional information related to an optical axis direction of projection optical system PL (the Z-axis direction), by irradiating a laser beam onto a reflection surface provided in a frame (not shown) on which the projection optical system PL is mounted via the reflection surface provided on Z tilt stage 58 inclined at an angle of 45°.

Based on measurement values of laser interferometer 54W, main controller 50 controls position setting operations of XY stage 14 and Z tilt stage 58, via a wafer stage drive section 56 (including a drive system of XY stage 14 and the drive system of Z tilt stage 58).

Figure 2:
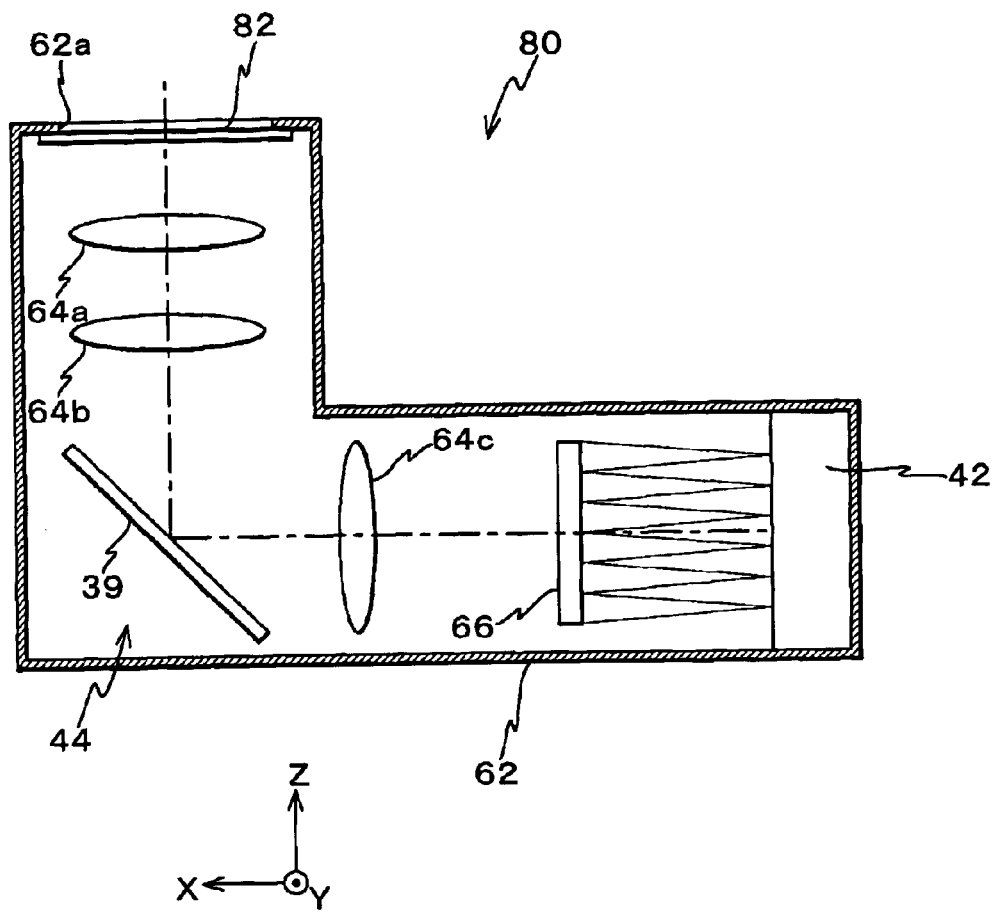
FIG. 2 is a view of an internal structure of a wavefront measurement instrument in FIG. 1.

In addition, on the end portion of Z tilt stage 58 on the +Y side, a wavefront measurement instrument 80 is fixed to measure wavefront aberration of projection optical system PL. As is shown in FIG. 2, wavefront measurement instrument 80 comprises: a housing 62 which inner space in an XZ section is shaped in the letter L; a photodetection optical system 44 made up of a plurality of optical elements arranged in a predetermined positional relationship inside housing 62; and a photodetection portion 42 arranged on the end portion inside housing 62 on the −X side. As wavefront measurement instrument 80, in the embodiment, a wavefront measurement instrument based on the Shack-Hartmann method is used.

More particularly, housing 62 is made of a hollow member, which XZ section shape is in the letter L, and on the topmost portion (the end in the +Z direction), an opening 62a is formed so that light enters into housing 62 from above. In addition, a cover glass 82 is arranged, covering opening 62a from below (on the inner side of housing 62). On the upper surface of cover glass 82, a light shielding film that has an opening in the center is formed, by evaporation coating of metal such as chromium, and the light shielding film cuts off unnecessary light from the periphery that may enter photodetection optical system 44 when measuring the wavefront aberration of projection optical system PL.

Photodetection optical system 44 is made up of parts arranged sequentially under cover glass 82 inside housing 62 in the following order: an objective lens 64a, a relay lens 64b, a deflection mirror 39; and arranged sequentially on the −X side of deflection mirror 39, a collimator lens 64c, and a microlens array 66. Deflection mirror 39 is arranged at an inclination of 45°, which bends the optical path of the light vertically incident on objective lens 64a from above to collimator lens 64c. The optical members making up photodetection optical system 44 are each fixed to the inner wall of housing 62 via holding members (not shown). Microlens array 66 is structured of a plurality of convex lenses (lens elements) being arranged in an array within a plane perpendicular with an optical axis of photodetection optical system 44.

Photodetection portion 42 is structured of a photodetection device made of a two-dimensional CCD or the like that detects light based on a photoelectric conversion method, and an electric circuit such as a circuit for controlling charge transport. The photodetection device has a detection area large enough to receive all the beams entering objective lens 64a and outgoing microlens array 66. Incidentally, measurement data by photodetection portion 42 is output to main controller 50 by signal lines or wireless transmission (refer to FIG. 1).

The operation of photodetection optical system 44 and photodetection portion 42 that are structured as is described above will be briefly described below. The beam that enters housing 62 via cover glass 82 of opening 62a is incident on objective lens 64a from above, and reaches mirror 39 via relay lens 64b. Mirror 39 then bends the optical path of the beam at an angle of 90°, and the beam is converted into parallel beams at collimator lens 64c and is incident on microlens array 66. The beam that has entered microlens allay 66 is condensed on the photodetection devices structuring photodetection portion 42 via each lens element that make up microlens allay 66, respectively. Then, the photodetection device photoelectrically converts the beams incident on each condensing point of the photodetection device, and the photoelectrically converted signals are converted into photodetection data by the electric circuit and sent to main controller 50 via signal lines or wireless transmission (refer to FIG. 1). Main controller 50 then calculates the image forming position based on the measurement data.

Referring back to FIG. 1, a multiple focal point detection system is provided in exposure apparatus 10 in the embodiment. The multiple focal point detection system (hereinafter referred to simply as a "focal point detection system") is based on an oblique incidence method, and is made up of an irradiation system 60a, which has a light source which on/off operation is under the control of main controller 50 and irradiates an image forming beam from an oblique direction to optical axis AX toward the image forming surface of projection optical system PL in order to form multiple pinhole or silt images, and a photodetection system 60b that receives the image forming beams reflected off the surface of wafer W. As the focal point detection system (60a and 60b), a system that has a similar structure to the one disclosed in, for example, Japanese Patent Application Laid-open No. 06-283403 and its corresponding U.S. Pat. No. 5,448,332, is used. As long as the national laws in designated states or elected states, to which this international application is applied, permit, the disclosures of the Japanese Patent Application Laid-open and the corresponding U.S. Patent cited above are fully incorporated herein by reference.

When scanning exposure is performed, main controller 50 controls the Z position and the inclination with respect to the XY plane of wafer W via wafer stage drive section 56 so that focal shift becomes zero, based on focal shift signals (defocus signals) such as S curve signals from photodetection system 60b, thus performing auto-focusing (automatic focusing) and auto-leveling. In addition, main controller 50 performs measurement and alignment of the Z position of wavefront measurement instrument 80 using the focal point detection system (60a and 60b) when measuring the wavefront aberration, which will be described later in the description. During the measurement, the inclination of wavefront measurement instrument 80 can also be measured, if necessary.

Furthermore, although it is omitted in the drawings, exposure apparatus 10 comprises an alignment system based on an off-axis method, which is used in, for example, measuring the position of alignment marks formed on wafer W held on wafer stage WST and fiducial marks formed on a fiducial mark plate. As the alignment system, for example, a sensor of an FIA (Field Image Alignment) system based on an image processing method can be used. With this sensor, a broadband detection beam that does not expose the resist on the wafer is irradiated onto a subject mark, and an image of the subject mark formed on a photodetection surface by the reflection beam of the subject mark and an index image (not shown) are picked up with an imaging device such as a CCD, then the imaging signals are output. As a matter of course, the alignment system is not limited to the FIA system, and an alignment sensor that irradiates a coherent detection beam onto a subject mark and detects scattering light as well as diffraction light generated from the subject mark, or an alignment sensor that detects two diffraction lights (for example, of the same order) generated from the subject mark made to interfere with each other can also be used, alone or combined.

As in FIG. 1, the control system is mainly structured with main controller 50. Main controller 50 is structured including a microcomputer (or a workstation) made up with parts such as a CPU (center processing unit), a ROM (read only memory), and a RAM (random access memory), and has control over the entire apparatus. For example, main controller 50 controls operations such as synchronous scanning of reticle R and wafer W and stepping operation of wafer W, so that exposure operations are accurately performed.

To be more specific, when scanning exposure is performed, for example, main controller 50 controls the position and velocity of reticle stage RST and wafer stage WST via reticle stage drive section 49 and wafer stage drive section 56, respectively, based on measurement values of laser interferometers 54R and 54W so that when reticle R is scanned via reticle stage RST in the +Y direction (or −Y direction) at a velocity $V_R=V$, wafer W is scanned in sync via wafer stage WST in the −Y direction (or +Y direction) with respect to exposure area IA at a velocity $V_W=\beta \cdot V$ ($\beta$ is the projection magnification from reticle R to wafer W). In addition, when stepping operations are performed, main controller 50 controls the position of wafer stage WST via wafer stage drive section 56, based on measurement values of laser interferometer 54W.

In addition, in the embodiment, main controller 50 corrects the image forming characteristics of projection optical system PL (such as distortion, coma, astigmatism, spherical aberration, and curvature of field) via image forming characteristics correction controller 78, based on measurement results of the wavefront aberration of projection optical system PL. The measurement is performed in the manner described below.

Next, the method of measuring the wavefront aberration of projection optical system PL in exposure apparatus 10 of the embodiment is described. In the description below, for the sake of simplicity, the aberration of photodetection optical system 44 in wavefront measurement instrument 80 is to be small enough to be ignored.

Main controller 50 moves wafer stage WST via wafer stage drive section 56, so that wavefront measurement instrument 80 is positioned below the alignment system based on the off-axis method (not shown). Then, main controller 50 detects alignment marks (not shown) provided in wavefront measurement instrument 80 with the alignment system, and based on the detection results and the measurement values of laser interferometer 54W when detection was performed, the positional coordinates of the alignment marks are calculated, and the precise position of wavefront measurement instrument 80 is obtained. And, after the position of wavefront measurement instrument 80 is measured, main controller 50 performs the measurement of the wavefront aberration in the following manner.

Figure 3:
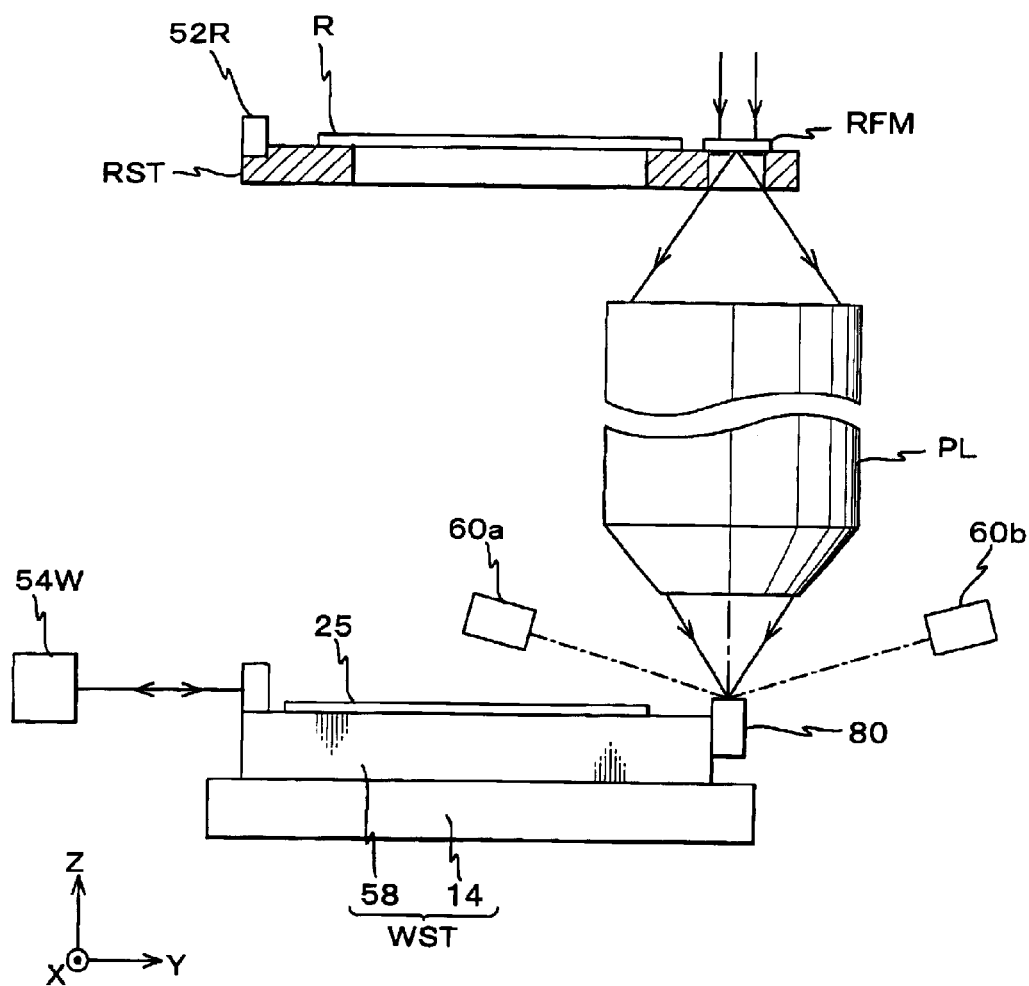
FIG. 3 is a view that shows a positional relationship between a reticle stage, a wafer stage, and a projection optical system when wavefront measurement is performed.

First of all, main controller 50 moves reticle stage RST so that reticle fiducial plate RFM on which the plurality of pinhole patterns (pinholes that make substantially ideal point light sources and generate spherical waves) are formed is positioned at each measurement point within the field of projection optical system PL determined in advance (refer to FIG. 3).

Then, main controller 50 provides control information to the light source (not shown) and makes it emit the laser beam. With this operation, illumination light IL is irradiated on reticle fiducial plate RFM from illumination system IOP. The light emitted from the plurality of pinholes of reticle fiducial mark plate RFM is condensed on an image plane via projection optical system PL, and the images of the pinholes are formed on the image plane.

Next, main controller 50 moves wafer stage WST via wafer stage drive section 56 while monitoring the measurement values of wafer laser interferometer 54W, so that the center of opening 62a in wavefront measurement instrument 80 substantially coincides with an image forming point of an image of one of the pinholes on reticle fiducial plate RFM (hereinafter referred to as "focused pinhole"). Upon this operation, main controller 50 finely drives Z tilt stage 58 in the Z-axis direction so that the upper surface of cover glass 82 of wavefront measurement instrument 80 coincides with the image plane on which the pinhole image is formed and adjusts the inclination angle of Z tilt stage 58 if necessary, based on the detection results of the focal point detection system (60a and 60b). Then, the imaging beam of the focused pinhole enters photodetection optical system 44 via the opening formed in the center of cover glass 82, and is received by the photodetection device that makes up photodetection portion 42. FIG. 3 shows the state of such measurement of wavefront aberration, after it has begun.

A spherical wave generated from the focused pinhole on the reticle fiducial plate RFM is made into parallel beams via projection optical system PL and objective lens 64a, relay lens 64b, mirror 39, and collimator lens 64c and irradiate microlens array 66. When microlens array 66 is irradiated as is described above, the pupil surface of projection optical system PL is divided by microlens array 66. Then, the each of the beams is condensed on the photodetection surface of the photodetection device with each lens element of microlens array 66, and the images of the pinholes (hereinafter referred to as a "spot image" or a "spot") are each formed on the photodetection surface.

Since projection optical system PL normally has a wavefront aberration, the wavefront of the parallel beams entering microlens array 66 shifts from the ideal wavefront (in this case, a plane), and depending on the shift, or in other words, the inclination of the wavefront with respect to the ideal wavefront, the image forming position of each spot shifts from the position on the optical axis of each lens element of microlens array 66. In this case, the shift of each spot from reference positions (positions on the optical axis of each lens element) corresponds to the inclination of the wavefront.

Then, the lights entering each of the condensing points of the photodetection devices making up photodetection portion 42 (the beams of the spot images) are photoelectrically converted at the respective photodetection devices, and the photoelectrically converted signals are sent to main controller 50 via the electric circuit. Main controller 50 then calculates the image forming position of each spot based on the photoelectrically converted signals, and furthermore, by using the calculated results and a positional data on reference points already known, positional deviation ($\Delta\xi$, $\Delta\eta$) is calculated and stored in the RAM. And, main controller 50 also stores the measurement values ($X_i$, $Y_i$) of laser interferometer 54W, along with the positional deviation ($\Delta\xi$, $\Delta\eta$).

When the measurement of the positional deviation of the spot image by wavefront measurement instrument 80 at the image forming point of the focused pinhole is completed in the manner described above, main controller 50 moves wafer stage WST so that the center of opening 62a of wavefront measurement instrument 80 substantially coincides with the next image forming point of the pinhole image. When this movement has been completed, in a manner similar to the above description, main controller 50 makes the light source emit the laser beam, and the image forming position of each spot is calculated in the same manner. Hereinafter, the measurement is sequentially performed in the same manner at the image forming points (measurement points arranged in a row) of other pinhole images. When the above measurement is performed, the reticle blind (not shown) in illumination optical system IOP may be used, for example, to change the position or the size of the illumination area on the reticle for each pinhole so that only the focused pinhole, or at least only an area including the focused pinhole is illuminated with illumination light IL.

When measurement at all measurement points arranged in a row in the X-axis direction is completed in the manner described above, main controller 50 moves reticle stage RST via reticle stage drive section 49 so that the position of the pinhole is set at the next measurement point. Then, hereinafter, the pinhole images which positions are set at the measurement points in the field of projection optical system PL are similarly measured.

When the measurements required are completed in the manner described above, data on both the positional deviation ($\Delta\mu$, $\Delta\eta$) of the spot image at the image forming point of each pinhole and the measurement values ($X_i$, $Y_i$) of laser interferometer 54W when the spot image is measured at the image forming point of each pinhole is stored in memory in main controller 50.

Main controller 50 then reproduces the wavefront, or in other words, calculates the wavefront aberration, using for example, the well-known Zernike polynomial expression, based on the positional deviation ($\Delta\xi$, $\Delta\eta$) stored in the memory that corresponds to the inclination of the wavefront in the pupil surface of projection optical system PL, which in turn corresponds to the image forming point of the pinhole image. Since this calculation method of the wavefront aberration is acknowledged, the details are omitted in the description. However, since it is not easy to simply integrate the inclination of the wavefront when it is provided only at spot positions, the surface shape is expanded and fitted into series. In this case, in order to perform efficient calculation, points that need to be considered are as follows: choosing an orthogonal system (a Zernike polynomial expression); the Zernike polynomial expression being a suitable series for expansion of an axial symmetric surface and the circumferential direction is to expand in trigonometric series; expressing the wavefront as a polar coordinate system ($\rho$, $\theta$); performing the fitting of the derivative based on the least squares method, since the derivation of the wavefront is detected as the above positional deviation; and the like.

Incidentally, the terms in the Zernike polynomial expression correspond to the optical aberration such as distortion, focus component, astigmatism, coma, and spherical aberration, respectively. Moreover, it is known that the low order terms substantially correspond to Seidel's aberrations. Accordingly, the image forming performance (the aberrations) of projection optical system PL can be obtained by using the Zernike polynomial expression.

Operation in the exposure process, including wavefront aberration measurement and correction in exposure apparatus 10 in the embodiment is described next, referring to a flow chart in FIG. 4 that shows a simplified control algorithm of the CPU in main controller 50, and also to other drawings as appropriate.

Figure 4:
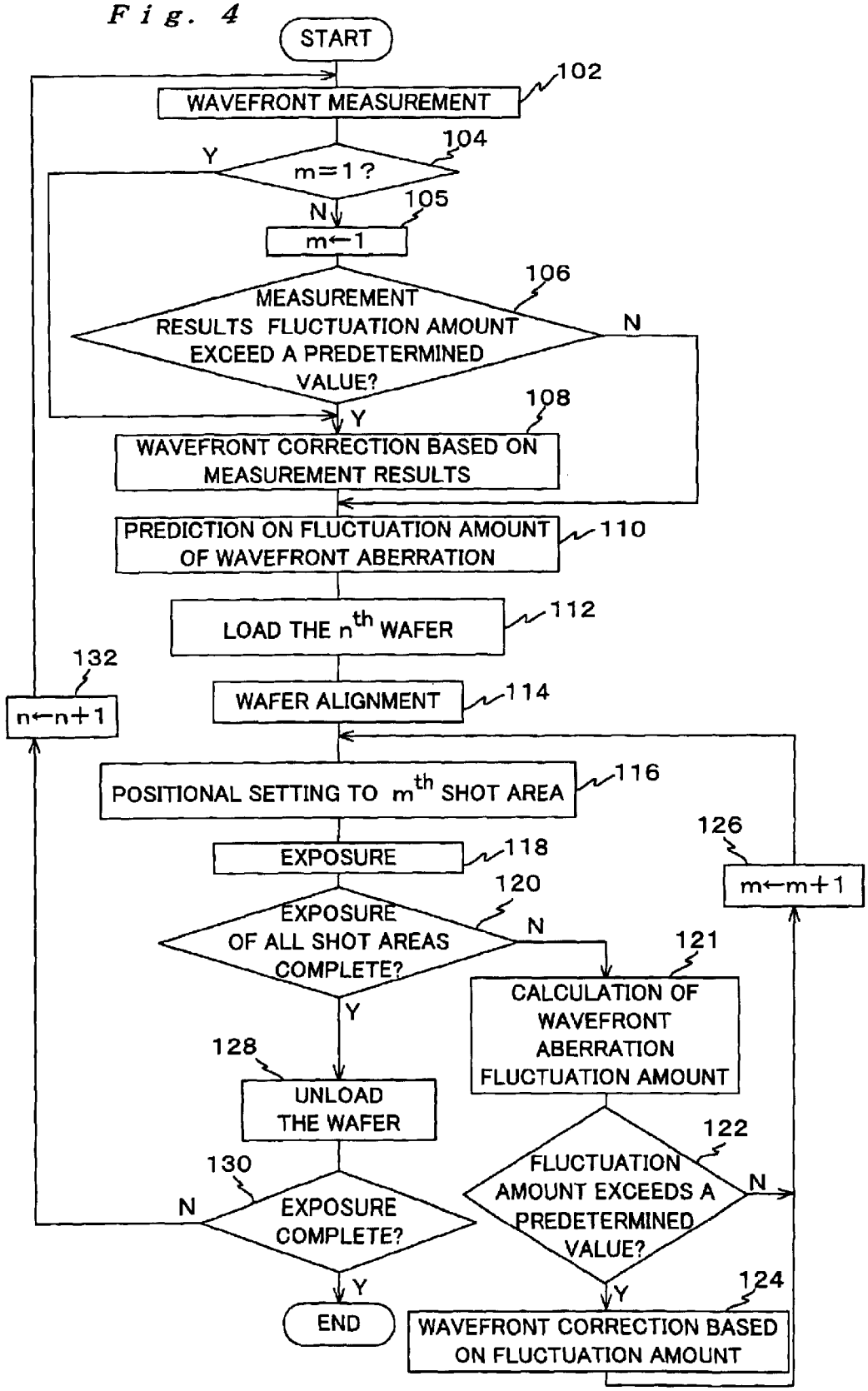
FIG. 4 is a flow chart of a simplified control algorithm of a CPU in a main controller during exposure operations.

The operation shown in the flow chart in FIG. 4 begins, when reticle R on which the circuit pattern is formed is loaded onto reticle stage RST via a reticle loader (not shown), and preparatory operations, such as reticle alignment and baseline measurement, have been completed. Details on the preparatory operations such as the above reticle alignment and baseline measurement are disclosed in, for example, Japanese Patent Application Laid-open No. 04-324923 and its corresponding U.S. Pat. No. 5,243,195. As long as the national laws in designated states or elected states, to which this international application is applied, permit, the disclosures of the Japanese Patent Application Laid-open and the corresponding U.S. Patent cited above are fully incorporated herein by reference.

In addition, as a premise, a counter value m of a first counter (not shown) that shows the shot number on wafer W and a counter value n of a second counter (not shown) that shows the wafer number are both to be set to "1" (to be described later) on initial setting. In addition, in the RAM in main controller 50, a map data MD, such as the one in FIG. 5A that shows the relation between the irradiation time of illumination light IL and the fluctuation amount of the wavefront aberration is to be stored in advance. Map data MD in FIG. 5A is a map data that is made, for example, during an experiment (or a simulation) in the adjustment stage of the exposure apparatus. In the experiment, the wavefront aberration of projection optical system PL is measured at a predetermined interval using wavefront measurement instrument 80, while illumination light IL is being irradiated. The measurement values obtained in the measurement are each plotted on an orthogonal coordinate system which axis of abscissa shows the time (the amount of irradiation) and axis of ordinate shows the amount of wavefront aberration (for example, an RMS value of a coefficient in each of the terms in the Zernike polynomial expression). Then the least square curve of each plotted point is obtained, which is made into a map data. Map data MD is used when predicting the fluctuation amount of the wavefront aberration that occurs during exposure of the shot areas on wafer W, which will be described later in the description.

First of all, in step 102, as is described earlier, the wavefront aberration of projection optical system PL is measured using reticle fiducial plate RFM, and the measurement results (for example, the RMS value of the coefficient in each of the terms in the Zernike polynomial expression) are stored in a predetermined area in the RAM In the next step, step 104, the judgment is made whether counter value m of the first counter referred to earlier is set to "1" or not. In this case, since counter value m is set to "1" in the initial setting, the judgment in step 104 is positive; therefore, the step proceeds to step 108. In step 108, wavefront correction (referred to earlier) that controls the correction mechanism is performed so that the state of the wavefront aberration of projection optical system PL nears the ideal state, based on the above measurement results. More particularly, the optical aberration to which the coefficient in each of the terms in the Zernike polynomial expression correspond, such as distortion, astigmatism, coma, spherical aberration, and curvature of field (focus) are calculated. Then, the image forming characteristics (such as distortion, astigmatism, coma, spherical aberration, and curvature of field) of projection optical system PL are corrected by providing a drive amount of the movable lenses as an instruction amount to image forming characteristics correction controller 78, so that the above calculated optical aberrations nears zero as much as possible.

In the next step, step 110, the fluctuation amount of the wavefront aberration due to exposure of a plurality of shot areas on wafer W that is to be exposed (in this case, the first wafer) is predicted, and the results of the prediction are stored into a temporary storage area in the RAM. More specifically, exposure time $S_1, S_2, S_3, \ldots, S_M$ (M is the number of the entire shot areas) required for exposing each of the shot areas on wafer W and the time required for stepping in between shots (that is, the time from when exposure of a shot area is completed until when exposure of the next shot area begins) $I_1, I_2, I_3, \ldots, I_{M-1}$ are obtained, and based on the results and map data MD in FIG. 5A, the fluctuation amount of wavefront aberration with respect to M numbers of shot areas on wafer W is predicted. As a consequence, for example, a fluctuation curve D2 can be obtained, as is shown in FIG. 5B, and fluctuation curve D2 is stored in the temporary storage area in the RAM. Fluctuation curve D2 is the data of the fluctuation of the wavefront aberration when none of the corrections are performed on the image forming characteristics of projection optical system PL.

In the next step, step 112, the $n^{th}$ wafer (in this case, the first wafer) W is loaded on wafer stage WST via a wafer loader (not shown). In the next step, step 114, wafer alignment such as EGA (Enhanced Global Alignment) which details are disclosed in, for example, Japanese Patent Application Laid-open No. 61-44429 and its corresponding U.S. Pat. No. 4,780,617, is performed, and the arrangement coordinates of all the shot areas on wafer W (in this case, M shot areas) are obtained. On this wafer alignment, wafer alignment marks, which are formed on a predetermined plurality of sample shots (at least 3) chosen in advance from the plurality of shot areas on wafer W, are measured with the alignment system. As long as the national laws in designated states or elected states, to which this international application is applied, permit, the disclosures of the Japanese Patent Application Laid-open and the corresponding U.S. Patent cited above are fully incorporated herein by reference.

In the next step, step 116, wafer stage WST is positioned to the starting position for scanning exposure of the first shot area on wafer W, based on the arrangement coordinates of each shot area on wafer W obtained in step 114 described above and the baseline amount obtained in advance, while the positional information sent from wafer interferometer 54W and reticle interferometer 54R are being monitored. And, along with wafer stage WST, reticle stage RST is also positioned at the starting position for scanning exposure.

Then in the next step, step 118, scanning exposure is performed on the first shot area in the following manner. When scanning exposure is performed, reticle stage RST and wafer stage WST are relatively scanned in opposite ways along the Y-axis direction, and when both stages RST and WST reach their target scanning velocity, illumination light IL begins to illuminate the pattern area of reticle R, which starts the scanning exposure. When exposure of the first area starts, a timer (not shown) also starts its measurement.

During scanning exposure, reticle stage RST and wafer stage WST are synchronously controlled so that movement velocity Vr of reticle stage RST in the Y-axis direction and movement velocity Vw of wafer stage WST in the Y-axis direction are maintained at a velocity ration corresponding to the projection magnification ratio of projection optical system PL.

Then, ultraviolet pulse light sequentially illuminates different pattern areas of reticle R, and when illumination of the entire pattern surface is completed, scanning exposure of the first shot area on wafer W is also completed. As a result, the circuit pattern of reticle R is reduced and transferred onto the first shot area via projection optical system PL.

When scanning exposure of the first shot area is completed in the manner described above, the step moves on to step 120. In step 120, the judgment is made whether exposure of all the shot areas on wafer W is complete, by judging whether m≧M (M is the number of all the shot areas on wafer W). At this stage, since only exposure of the first shot area has been completed, m=1, therefore, the judgment at this stage is negative, and the step proceed to step 121.

In step 121, the fluctuation amount of the wavefront aberration from before the exposure of the previous shot area starts up until this point is calculated. More specifically, a predicted value $P_j$ and a predicted value $P_{j-1}$ are taken out from the RAM, and the difference of the two values $\Delta P = (P_j - P_{j-1})$ is calculated. $P_j$ is a predicted value of the wavefront aberration in the fluctuation curve D2 at measurement time $S_j$, that is, the time measured by the timer up to this point (the elapse of time from the beginning of measurement), and $P_{j-1}$ is a predicted value of the wavefront aberration in the fluctuation curve D2 at a point before starting the measurement, that is, a point before exposure of the previous shot area begins. In this case, i=1, 2, ..., M, and j=1, 2, .... M.

In the next step, step 122, the judgment is made whether the fluctuation amount $\Delta P$ of the wavefront aberration calculated in step 121 exceeds a predetermined value $\alpha$. In this case, $\alpha$ is set to a value within a permissible range at a level in which the fluctuation amount of the wavefront aberration that affects the exposure accuracy can be ignored (refer to FIG. 5B). At this point (the point where exposure of the first shot has been completed), since time $S_1$, which is shown in FIG. 5B, has passed, predicted value $P_1$ of the wavefront aberration is read from the RAM. The fluctuation amount of the wavefront aberration at this point is calculated as $\Delta P = (P_1 - 0) = P_1$, as is shown in FIG. 5B. In this case, since the fluctuation amount $\Delta P$ exceeds the predetermined amount $\alpha$, the judgment in step 122 turns out to be positive, and the step proceeds to step 124.

In step 124, the image forming characteristics of projection optical system PL is adjusted in a similar manner as in step 108, by giving instructions to image forming characteristics correction controller 78 based on the fluctuation amount calculated in step 121, and wavefront correction is performed so that the fluctuation amount of the wavefront aberration nears zero as much as possible (refer to the $I_1$ portion along the temporal axis of wavefront fluctuation curve D1 shown in a solid line in FIG. 5B).

Next, in step 126, after the counter value m of the first counter is increased by one increment, the step returns to step 116 and the processing and judgment after step 116 is repeated.

More particularly, in step 116, stepping operations is performed in order to move wafer stage WST to the starting position for scanning exposure of the second shot area, then in step 118, exposure of the second shot area is performed, and then the step proceeds to step 120. In this case, since only exposure of the second shot has been completed, the judgment in step 120 is negative, therefore, in step 121, the fluctuation amount of the wavefront aberration at the point when exposure of the second shot area is completed, or in other words, irradiation time $S_2$, is calculated in a similar manner as above. Thus, predicted value $P_2$ and predicted value $P_1$ are taken out from the RAM, $P_2$ being a predicted value of the wavefront aberration in the fluctuation curve D2 at measurement time $S_2$ and $P_1$ being a predicted value of the wavefront aberration in the fluctuation curve D2 at the point when the measurement begins (this point is when the exposure of the first shot area has been completed, and since the time required to move from the first shot to the second shot is extremely short, the fluctuation of the wavefront aberration during the short period can be ignored). Then, the fluctuation amount of the wavefront aberration of projection optical system PL during irradiation time $S_2$ is calculated. In this case, as is shown in FIGS. 5A and 5B, the fluctuation amount of the wavefront aberration $\Delta P$ is $\Delta P = P_2 - P_1$.

In the next step, step 122, the judgment is made whether the fluctuation amount of the wavefront aberration calculated in step 121 exceeds predetermined value $\alpha$. In this case, as is shown in FIG. 5B, since the fluctuation amount $\Delta P = P_2 - P_1$ does not exceed predetermined value $\alpha$, the judgment in this case is negative, so the step proceeds to step 122 and the counter value m of the first counter is increased by one increment, and then the step returns to step 116, and hereinafter the processing and judgment after step 116 is repeated in a similar manner as is previously described. In the embodiment, as it can be seen from wavefront fluctuation curve D1 shown in a solid line in FIG. 5B, wavefront aberration correction is performed only at times such as time $I_1, I_3, I_6, \ldots$, and so forth. Then, until the result of step 120 turns out to be affirmative, the above loop is repeated, and when exposure of the m numbers of shot areas on wafer W is completed and the judgment in step 120 results positive, the step then proceeds to step 128 and the first wafer W is unloaded from wafer stage WST via a wafer unloader (not shown).

In the next step, step 130, the judgment whether the exposure has been completed or not is made, by seeing if either of the conditions is satisfied: whether the counter value n of the second counter matches N (n=N, N being the number of wafers to be exposed), or instructions to complete exposure has been input by an operator. In this case, since only exposure of the first wafer has been completed, the judgment is negative. Therefore, in step 132, the counter value n of the second counter is increased by one increment, and the step returns to step 102 and the processing and judgment after step 102 is repeated.

In this case, after the wavefront aberration of projection optical system PL is measured in a similar manner as in step 102, in step 104, the counter value m of the first counter is checked to see if the number is "1" or not. And, since the number is not 1 (m=M≠1), the step proceeds to step 105, and after the counter value m is reset to the initial value "1" in step 105, the step moves on to step 106. Then, in step 106, the fluctuation amount of the wavefront aberration is checked to see if it has exceeded a predetermined amount (β) from the last measurement (the last measurement, which is when the wavefront aberration was measured before exposure of the first wafer started) or not. In the embodiment, since wavefront correction is performed when necessary in step 124 while a plurality of shot areas are being exposed, normally, the judgment in step 106 turns out to be negative. And, when the judgment in step 106 is negative, the step then moves onto step 110, and in a similar manner as is described above, the fluctuation amount of the wavefront aberration that occurs when exposing a plurality of shot areas on a wafer W to be exposed next (the $n^{th}$ wafer) is predicted, and the prediction results stored in the temporary storage area in the RAM.

Meanwhile, when the wavefront aberration of projection optical system PL has exceeded the predetermined value β from just before the beginning of exposure of the previous wafer for some reason, the judgment in step 106 turns out to be positive. In this case, wavefront correction is performed in step 108 as is previously described, and after this step, the step proceeds to step 110. And, in step 110, the fluctuation amount of wavefront aberration that occurs when exposing a plurality of shot areas on wafer W to be exposed next (the $n^{th}$ wafer) is predicted, and the prediction results stored in the temporary storage area in the RAM.

Then, in step 112, when second wafer W is loaded onto wafer stage WST via the wafer loader (not shown), the wafer is processed in a similar manner as that of the first wafer. Likewise, from the third wafer and then onward, the wafers are processed in a similar manner as that of the first wafer and the second wafer.

When either of the following conditions is satisfied, that is, the pattern of reticle R has been transferred onto each shot area on the $N^{th}$ wafer based on the step-and-scan method, or the operator gives instructions to end the exposure operation, then the judgment in step 130 turns out to be positive, and the series of processes in the routine is completed.

As is obvious from the description so far, in the embodiment, main controller 50 and software that performs the processing algorithm (the flow chart in FIG. 4) make up a first controller, a second controller, and a judgment unit. As a matter of course, a part of the first controller, the second controller, and the judgment unit may be composed of hardware. In this case, the first controller, the second controller, and the judgment unit may be structured separately, or two units of the first controller, the second controller, and the judgment unit may be of the same hardware.

As is described so far, in exposure apparatus 10 in the embodiment, the reticle fiducial plate RFM on which a plurality of pinhole shaped patterns are formed is fixed on reticle stage RST, and wavefront measurement instrument 80 is fixed on wafer stage WST. In addition, main controller 50 adjusts the position of reticle stage RST and wafer stage WST to position wavefront measurement instrument 80 fixed on wafer stage WST at the projection position of the pinhole shaped patterns by projection optical system PL, illuminates illumination light IL on the pinhole shaped patterns of reticle fiducial plate RFM from illumination optical system IOP, and performs the wavefront aberration measurement using the wavefront measurement instrument 80 to measure the wavefront aberration of projection optical system PL. This allows the wavefront aberration measurement of projection optical system PL to be performed automatically at a desired timing. Accordingly, with exposure apparatus 10 in the embodiment, the wavefront aberration measurement of projection optical system PL can be performed easily at a desired timing, which allows quality control of projection optical system PL to be performed sufficiently. In addition, in the embodiment, the wavefront aberration measurement of the projection optical system can be performed without performing tasks like mounting a special reticle used for measurement on reticle stage RST, or attaching the wavefront measurement instrument to wafer stage WST.

In addition, in exposure apparatus 10, main controller 50 corrects the wavefront aberration of the projection optical system via the correction mechanism (such as 78 and 74a to 74c) previously described, to that the state of the wavefront aberration of projection optical system PL nears the ideal state, based on the measurement results of the wavefront aberration. Therefore, the image forming characteristics of projection optical system PL can be favorably maintained, and since exposure is performed using such projection optical system PL, the pattern of reticle R can be transferred onto each of the shot areas on wafer W with good overlay accuracy.

In addition, in the embodiment, main controller 50 measures the wavefront aberration each time before the wafer is exposed, and judges whether the fluctuation amount of the wavefront aberration has exceeded a predetermined value from the previous wavefront measurement based on the measurement results. Then, main controller 50 performs wavefront correction only when the judgment turns out to be positive, therefore, throughput can be improved while substantially maintaining the image forming characteristics of the projection optical system, compared with when wavefront correction is performed each time before exposing the wafer.

In addition, in the embodiment, main controller 50 measures the wavefront aberration each time before the wafer is exposed, and based on the results predicts the fluctuation amount of the wavefront aberration that occurs when exposing the plurality of shot areas on the wafer that is to be exposed next. Then, each time before starting exposure of a shot area, main controller 50 judges whether the fluctuation amount of the wavefront aberration has exceeded a predetermined value from just before starting exposure of the previous shot area. And then, main controller 50 performs wavefront correction only when the judgment turns out to be positive, therefore, throughput can be improved while substantially maintaining the overlay accuracy on exposure, compared with when wavefront correction is performed each time before exposing the wafer.

In the above embodiment, the case has been described where wavefront measurement instrument 80 is fixed to wafer stage WST, however, the present invention is not limited to this and the wavefront measurement instrument does not necessarily have to be fixed on wafer stage WST. For example, a detachable wavefront measurement instrument that has a structure similar to wavefront measurement instrument 80 can be provided, and the wavefront measurement instrument can be attached to wafer stage WST and used to measure the wavefront aberration of projection optical system PL. Even in such a case, since the measurement reticle does not have to be loaded/unloaded on reticle stage RST, throughput can be improved compared with the conventional exposure apparatus. In addition, in this case, a wavefront measurement instrument that is shaped so that it can be exchanged with the wafer holder may be used as the wavefront measurement instrument. In such a case, the wavefront aberration measurement instrument can be automatically carried using a carriage system (such as the wafer loader) that exchanges the wafer and wafer holder.

In addition, when wavefront measurement instrument 80 is arranged on wafer stage WST at all times as in the above embodiment, an arrangement can be employed where only a part of wavefront measurement instrument 80 is arranged on the wafer stage and the rest arranged exterior of the wafer stage.

In addition, in the above embodiment, the aberration of the photodetection optical system of wavefront measurement instrument 80 has been ignored, however, the wavefront aberration may be taken into account when determining the wavefront aberration of projection optical system PL.

Figure 6:
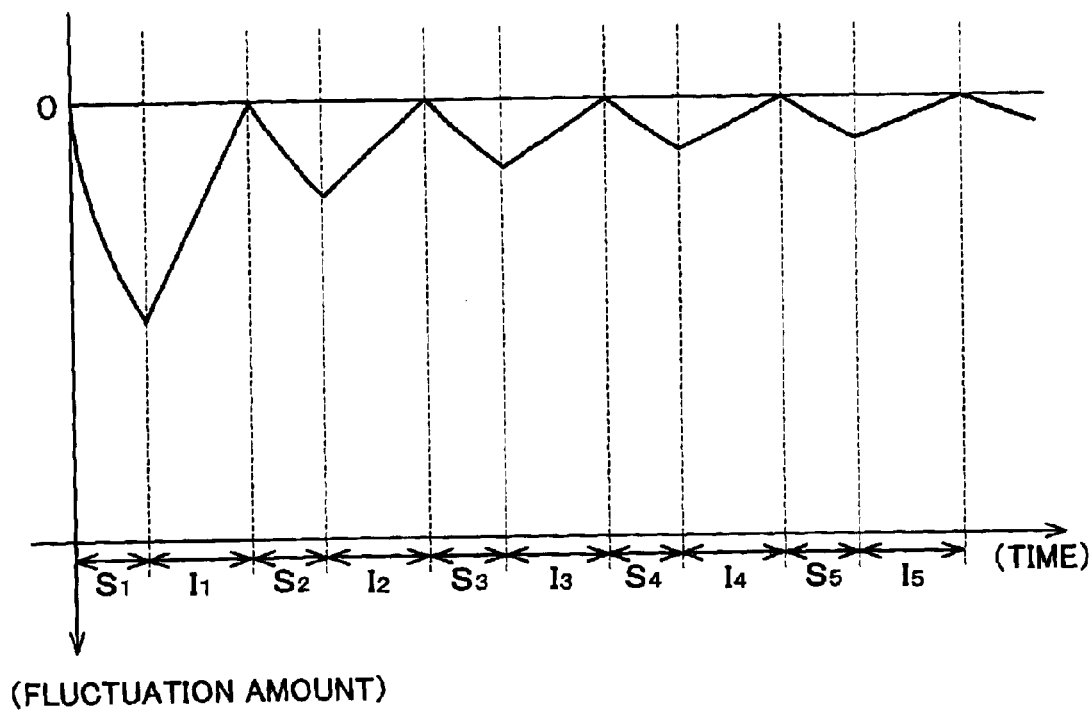
FIG. 6 is a line drawing that shows a fluctuation of wavefront aberration when performing wavefront correction between each stepping operation.

In addition, in the above embodiment, main controller 50 predicts the fluctuation amount of the wavefront aberration that occurs when exposing each shot area on the wafer before beginning to expose the wafer, and before main controller 50 starts exposure of each shot area, judges whether the fluctuation amount of the wavefront aberration has exceeded a predetermined value from just before starting exposure of the previous shot area. And then, main controller 50 performs wavefront correction only when the judgment turns out to be positive. However, the present invention is not limited to this. For example, the wavefront correction can be performed during each stepping operation between shots, without performing the judgment step of whether the above amount of fluctuation of the wavefront aberration has exceeded a predetermined value or not. In this case, since the fluctuation amount of wavefront aberration is as is shown in FIG. 6, a slight decrease in throughput cannot be denied compared with the case in FIG. 5B, however, exposure in which the overlay accuracy is more favorable in each shot area can be performed.

In addition, in the above embodiment, main controller 50 performs measurement of the wavefront aberration just before exposure begins on the wafer, and judges whether the fluctuation amount of the wavefront aberration has exceeded a predetermined value from the previous wavefront measurement based on the measurement results. Then, main controller 50 performs wavefront correction only when the judgment turns out to be positive. However, the present invention is not limited to this, and the wavefront correction may be performed each time the wavefront aberration is measured.

In the above embodiment, for the sake of simplicity in describing the embodiment, stepping operations and wafer exchange is performed after correcting the wavefront aberration in projection optical system PL. However, correcting the wavefront aberration and stepping operations, and correcting the wavefront aberration and wafer exchange can be performed at the same time.

In addition, in the above embodiment, the wavefront measurement is performed on wafer exchange (after the wafer has been unloaded). The present invention, however, is not limited to this and for example, the wavefront measurement may be performed after wafer exchange and wafer alignment have been performed, that is, just before exposure begins.

In addition, in the above embodiment, the fluctuation amount of the wavefront aberration is measured at each wafer exchange and the fluctuation of the wavefront aberration is predicted for each stepping operation, and based on the results the wavefront aberration of the projection optical system is corrected. However, correcting the wavefront aberration on each stepping operation may be omitted, and only the wavefront measurement and correction may be performed on each wafer exchange.

In addition, in the above embodiment, the fluctuation amount of the wavefront aberration is measured per each wafer exchange. The measurement, however, may be performed per wafer number. In this case, main controller 50 may perform the wavefront correction each time the wavefront measurement is performed, or only when the fluctuation amount of the wavefront aberration from the previous wavefront measurement is judged to exceed a predetermined value in the judgment process.

Besides what is described above, main controller 50 may measure the above wavefront aberration every p wafers (p is an integer of two and over), just before beginning to expose the wafer. In this case, the fluctuation amount of the wavefront aberration that occurs when the next plurality of shot areas on the p wafers is exposed may be predicted based on the measurement results, each time the wavefront measurement is performed. Then, main controller 50 may judge whether the fluctuation amount of the wavefront aberration from before beginning exposure k shot areas earlier has exceeded a predetermined value, each time before beginning to expose k shot areas (k is an integer of two and over), and may perform the wavefront correction based on the predicted results only if the judgment turns out to be positive (immediately before starting exposure of k shot areas). Or, each time the wavefront measurement is performed, based on the measurement results main controller 50 may predict the fluctuation amount of the wavefront aberration that occurs when the next plurality of shot areas on the p wafers is exposed, and may perform the wavefront correction each time before beginning to expose k shot areas (k is an integer of two and over) based on the predicted results.

As is described, various changes may be combined such as: the timing (or interval) to measure the wavefront aberration of projection optical system PL, the timing (or interval) to perform the wavefront correction, whether to predict the fluctuation amount of the wavefront aberration of the projection optical system that occurs on exposure, and whether to perform judgment on performing the wavefront aberration or not. The wavefront aberration of projection optical system PL (or the image forming characteristics) can be favorably maintained, the shorter the measurement intervals of wavefront aberration are, or the shorter the intervals between the wavefront corrections are. On the other hand, the longer the measurement intervals of wavefront aberration are, or the longer the intervals between the wavefront corrections are, and furthermore, when performing judgment of whether to perform the wavefront correction, throughput can be improved. In addition, the exposure accuracy decreases while the throughput improves in the following order: a. when the wavefront correction is performed each time the wavefront aberration is measured, without predicting the fluctuation amount of wavefront aberration in the projection optical system that occurs on exposure, b. when the fluctuation amount of wavefront aberration in the projection optical system that occurs on exposure is predicted each time the wavefront aberration is measured based on the measurement results, and based on the predicted results, the wavefront correction is performed without any judgment of whether to perform wavefront correction, and c. when the fluctuation amount of wavefront aberration in the projection optical system that occurs on exposure is predicted each time the wavefront aberration is measured based on the measurement results, and the wavefront correction is performed only when correction is necessary according to the judgment of whether to perform the wavefront correction based on the predicted results. In short, the combination may be decided, depending on the required exposure accuracy and throughput.

In the above embodiment, the map data that shows the relation between the irradiation time and the fluctuation of the wavefront aberration for predicting the fluctuation of the wavefront aberration by each shot area is stored in memory of main controller 50, however, other conditions may also be stored in memory, such as, various map data according to different illumination conditions or environment, or a prediction of the fluctuation amount by calculating various changes in conditions.

In addition, in the above embodiment, the calculation of the fluctuation amount of the wavefront aberration between shot areas is performed based on the measurement of the timer. The present invention, however, is not limited to this, and the total value of the energy of illumination light IL actually irradiated on projection optical system PL may be monitored, based on measurement values of a photodetection unit provided in illumination system IOP for controlling the dose amount, and the fluctuation amount of the wavefront aberration between shot areas may be calculated similarly as in the above embodiment based on the monitored results.

In the above embodiment, a different photodetection portion may be newly provided, which is structured similar to photodetection portion 42, for measuring the pupil shape of projection optical system PL. For example, a half mirror can be arranged with an inclination, such as 45°, on the optical path between collimator lens 64c and microlens array 66 shown in FIG. 2, and the newly provided photodetection portion can be arranged at a position on the optical path of the light reflected off the half mirror optically conjugate with the pupil position of projection optical system PL. When such an arrangement is employed, the positional relationship between the center of the pupil surface (pupil center) of the projection optical system and the center of the photodetection surface of photodetection portion 42 can be obtained, based on the photodetection results of the newly provided photodetection portion, allowing the relation between the pupil center and the image forming position of the spot image, or in other words, the positional deviation of the spot image with respect to the pupil center to be obtained. In addition, the pupil center can be made to coincide with the center of the photodetection surface, when necessary.

In addition, in the above embodiment, in order to measure the wavefront aberration of projection optical system PL with good accuracy, a preliminary measurement to measure the wavefront aberration may be performed on projection optical system PL prior to the fine wavefront aberration measurement. In this case, the defocus component and the inclination component of the surface of cover glass 82 (the surface optically conjugate with the photodetection surface of photodetection portion 42) that structures wavefront measurement instrument 80 with respect to the image plane of projection optical system PL is calculated, based on the results of the preliminary measurement, and the position in the Z-axis direction and tilt of wavefront measurement instrument 80 is adjusted by using the defocus component and the inclination component. Then, when the defocus component and inclination component are sufficiently small, the fine wavefront aberration measurement can be started.

In addition, in the above embodiment, there are no substantial changes in the wavefront aberration during the time in which illumination light IL is not irradiated, however, the change in the wavefront aberration during the time in which illumination light IL is not irradiated may be predicted.

In the above embodiment, when beams in the wavelength range called the vacuum ultraviolet region, which is light belonging to the wavelength range of 200 nm to 150 nm, used as the exposure light, the light is greatly absorbed by oxygen and organic matters (and in the case of the $F_2$ laser, including water vapor, hydrocarbon gas, and the like as well). Therefore, in order to decrease the concentration of these gases in the optical path where the exposure light passes so that it does not exceed the level of several ppms, the gases in the optical path has to be replaced (purged) with an inert gas, such as nitrogen or helium.

In the embodiment above, a pulse laser light source in the vacuum ultraviolet region such as the $F_2$ laser or the ArF excimer laser is used as the light source. However, the present invention is not limited to this, and an ultraviolet light source such as the KrF excimer laser light source (output wavelength: 248 nm), or other vacuum ultraviolet light sources such as the $Ar_2$ excimer laser light source (output wavelength: 126 nm) may also be used. In addition, for example, a harmonic may be used, which is obtained by amplifying a single-wavelength laser beam in the infrared or visible range emitted by a DFB semiconductor laser or fiber laser, with a fiber amplifier doped with, for example, erbium ((Er) or both erbium and ytteribium (Yb)), and by converting the wavelength into ultraviolet light using a nonlinear optical crystal.

In the above embodiment, the present invention has been applied to a scanning exposure apparatus based on a step-and-scan method, however the scope of the invention is, of course, not limited to this. In other words, the present invention can also be suitably applied to a reduction projection exposure apparatus based on a step-and-repeat method.

The exposure apparatus in the above embodiment can be made by incorporating the illumination optical system made up of a plurality of lenses and the projection optical system into the main body of the exposure apparatus and performing optical adjustment, while incorporating the reticle stage and the wafer stage that are made up of various mechanical components into the main body of the exposure apparatus, connecting the wiring and piping, and furthermore, performing total adjustment (electrical adjustment, operational adjustment). The exposure apparatus is preferably made in a clean room in which temperature, degree of cleanliness, and the like are controlled.

In the above embodiment, the case has been described where the present invention is applied to an exposure apparatus for manufacturing semiconductors. The present invention, however, is not limited to this, and it may also broadly be applied to an exposure apparatus that transfers crystal display device patterns onto a square shaped glass plate, or to an exposure apparatus that manufactures a thin film magnetic head, a pick-up device, a micromachine, or a DNA chip, or the like.

In addition, the present invention can be applied, not only to an exposure apparatus that manufactures microdevices such as semiconductors but also to an exposure apparatus that transfers a circuit pattern onto a glass substrate or a silicon wafer for producing a reticle or a mask, which is used in an optical exposure apparatus, an EUV exposure apparatus, an X-ray exposure apparatus, an electron beam exposure apparatus, or the like. Normally, an exposure apparatus that uses DUV (deep ultraviolet) light or VUV (vacuum ultraviolet) light uses a transmittance type reticle, and as the reticle substrate materials such as silica glass, fluorine-doped silica glass, fluorite, magnesium fluoride, or crystal are used.

Semiconductor devices are manufactured through the following steps: the step of designing the function and performance of the device; the step of manufacturing a reticle based on the design step; the step of manufacturing a wafer from a silicon material; the step of transferring a reticle pattern onto the wafer by using the exposure apparatus of the above embodiment; the device assembly step (which includes dicing, bonding, and packaging process); the inspection step, and the like. Following are the details on the device manufacturing method.

<<Device Manufacturing Method>>

Figure 7:
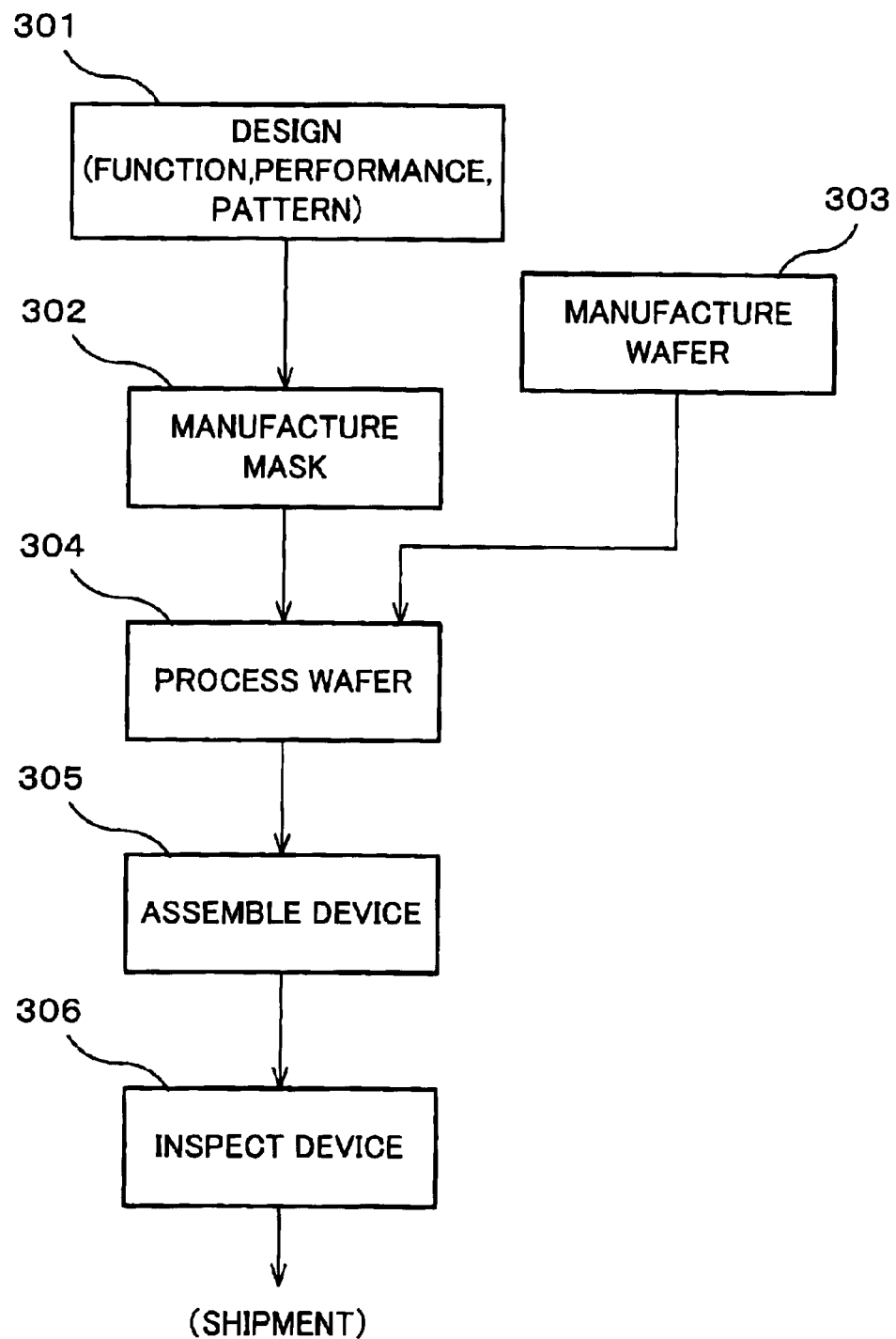
FIG. 7 is a flow chart for explaining an embodiment of a device manufacturing method according to the present invention.

FIG. 7 is a flow chart showing an example of manufacturing a device (a semiconductor chip such as an IC or an LSI, a liquid crystal panel, a CCD, a thin magnetic head, a micromachine, or the like). As shown in FIG. 7, in step 301 (design step), function/performance is designed for a device (e.g., circuit design for a semiconductor device) and a pattern to implement the function is designed. In step 302 (mask manufacturing step), a mask on which the designed circuit pattern is formed is manufactured, whereas, in step 303 (wafer manufacturing step), a wafer is manufacturing by using a silicon material or the like.

In step 304 (wafer processing step), an actual circuit and the like is formed on the wafer by lithography or the like using the mask and wafer prepared in steps 301 to 303, as will be described later. Next, in step 305 (device assembly step) a device is assembled using the wafer processed in step 304. The step 305 includes processes such as dicing, bonding, and packaging (chip encapsulation), as necessary.

Finally, in step 306 (inspection step), tests on operation, durability, and the like are performed on the device processed in step 305. After these steps, the device is completed and shipped out.

Figure 8:
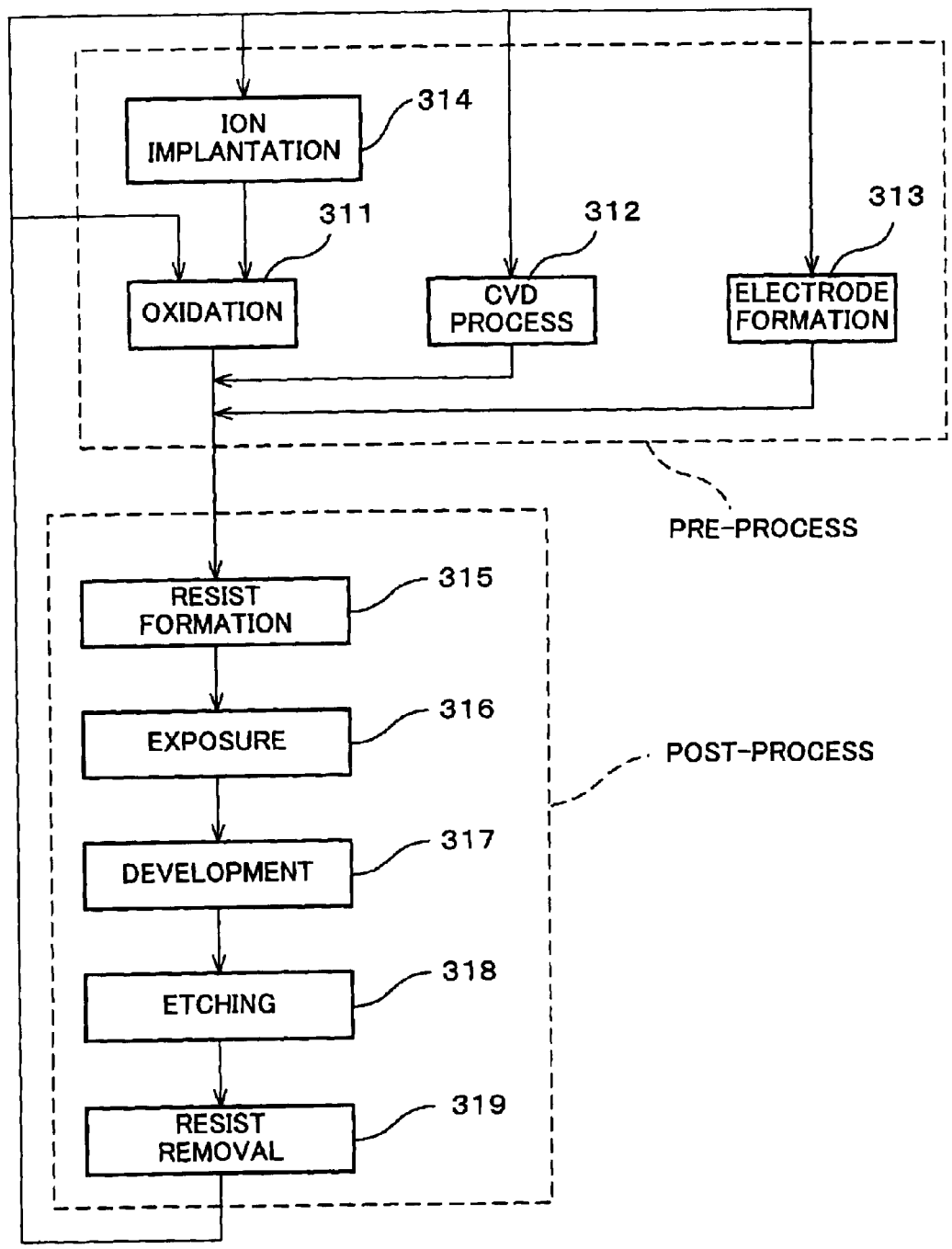
FIG. 8 is a flow chart for showing a process in step 304 in FIG. 7.

FIG. 8 is a flow chart showing a detailed example of step 304 described above in manufacturing the semiconductor device. Referring to FIG. 8, in step 311 (oxidation step), the surface of the wafer is oxidized. In step 312 (CVD step), an insulating film is formed on the wafer surface. In step 313 (electrode formation step), an electrode is formed on the wafer by vapor deposition. In step 314 (ion implantation step), ions are implanted into the wafer. Steps 311 to 314 described above make up a pre-process for the respective steps in the wafer process, and are selectively executed depending on the processing required in the respective steps.

When the above pre-process is completed in the respective steps in the wafer process, a post-process is executed in the following manner. In this post-process, first, in step 315 (resist formation step), the wafer is coated with a photosensitive agent. Next, in step 316 (exposure step), the circuit pattern on the mask is transferred onto the wafer by the exposure apparatus and the exposure method described above. And, in step 317 (development step), the wafer that has been exposed is developed. Then, in step 318 (etching step), an exposed member of an area other than the area where the resist remains is removed by etching. Finally, in step 319 (resist removing step), when etching is completed, the resist that is no longer necessary is removed.

By repeatedly performing these pre-process and post-process steps, multiple circuit patterns are formed on the wafer.

When using the device manufacturing method described so far in the embodiment, since exposure apparatus 10 and the exposure method in the above embodiment are used in the exposure process (step 316), the pattern can be transferred onto the wafer with good precision. Accordingly, microdevices that have higher integration can be produced with good productivity (including yield).

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. An exposure apparatus that illuminates a mask on which a pattern is formed with an illumination light from an illumination system and transfers said pattern onto a substrate via a projection optical system, said exposure apparatus comprising:

a mask stage that moves holding said mask;

a pattern plate mounted on said mask stage and at a position different from said mask, on which at least one pinhole shaped aperture pattern is formed; and a substrate stage that moves holding said substrate.

2. The exposure apparatus of claim 1, further comprising:

a wavefront measurement instrument mounted on said substrate stage; and a first control unit that is coupled to said wavefront measurement instrument, and performs wavefront measurement to measure wavefront aberration of said projection optical system using said wavefront measurement instrument, by adjusting a position of at least one of said mask stage and said substrate stage so that said wavefront measurement instrument is positioned at a projection position of said aperture pattern by said projection optical system, and irradiating said aperture pattern on said pattern plate with illumination light from said illumination system.

3. The exposure apparatus of claim 2, further comprising:

a correction mechanism that is provided to said projection optical system, and corrects wavefront aberration of said projection optical system; and a second control unit that is coupled to said correction mechanism, and performs wavefront correction by controlling said correction mechanism, based on a result of said wavefront aberration measurement.

4. The exposure apparatus of claim 3 wherein when said pattern is sequentially transferred onto a plurality of substrates via said projection optical system, said first control unit performs said wavefront measurement each time before exposure of a predetermined number of substrates begins, and said second control unit performs said wavefront correction each time when said wavefront measurement is performed.

5. The exposure apparatus of claim 3 wherein when said pattern is sequentially transferred onto a plurality of substrates via said projection optical system, said first control unit performs said wavefront measurement each time before exposure on a predetermined number of substrates begins, said exposure apparatus further comprising:

a judgment unit that judges whether a fluctuation amount of wavefront aberration from
a previous measurement exceeds a predetermined value when said wavefront measurement is performed, and
said second control unit performs said wavefront correction when said judgment unit judges that said fluctuation amount exceeds a predetermined value.

6. The exposure apparatus of claim 3 wherein when said pattern is sequentially transferred onto a plurality of divided areas on a plurality of substrates via said projection optical system,
said first control unit performs said wavefront measurement each time before exposure of a predetermined number of substrates begins, and
said second control unit predicts a fluctuation amount of wavefront aberration that occurs when exposing said plurality of divided areas on said plurality of substrates in the next exposure based on a result of said wavefront measurement each time said wavefront measurement is performed, and performs said wavefront correction based on results of said prediction each time before exposure of a predetermined number of divided areas among said plurality of divided areas on each substrate begins.

7. The exposure apparatus of claim 3 wherein when said pattern is sequentially transferred onto a plurality of divided areas on a plurality of substrates via said projection optical system,
said first control unit performs said wavefront measurement each time before exposure of a predetermined number of substrates begins, said exposure apparatus further comprising:
a judgment unit that predicts a fluctuation amount of wavefront aberration that occurs when exposing said plurality of divided areas on said plurality of substrates in the next exposure based on a result of said wavefront measurement each time said wavefront measurement is performed, and judges whether a fluctuation amount of wavefront aberration from before exposure previously performed on divided areas a predetermined numbers earlier begins has exceeded a predetermined value or not, each time before exposure of said predetermined number of divided areas among said plurality of divided areas on each substrate begins, and
said second control unit performs said wavefront correction based on a result of said prediction before exposure of the next predetermined number of divided areas begins, when said judgment unit judges that said fluctuation amount has exceeded a predetermined value.

8. A device manufacturing method including a lithographic process, wherein in the lithographic process exposure is performed using the exposure apparatus in claim 1.

9. An exposure method in which a mask where a pattern is formed is illuminated with an illumination light and said pattern is sequentially transferred onto a plurality of substrates via a projection optical system, said exposure method comprising:
a wavefront aberration measurement process in which wavefront aberration of said projection optical system is measured before exposure of a predetermined number of substrates begins;
a prediction process in which a fluctuation amount of wavefront aberration of said protection optical system is predicted, based on a result of said wavefront measurement; and
a wavefront aberration correction process in which wavefront aberration of said projection optical system is corrected, based on a result of said prediction.

10. The exposure method of claim 9 wherein procedure in said wavefront aberration correction process is performed when said wavefront aberration measurement is performed.

11. The exposure method of claim 9, wherein
in said prediction process, a fluctuation amount of wavefront aberration occurring when exposing a plurality of divided areas on said predetermined number of substrates in the next exposure is predicted, based on a result of said wavefront measurement each time said wavefront measurement is performed, and
in said wavefront aberration correction process, said wavefront aberration correction is performed based on a result of said prediction, each time before exposure of a predetermined number of divided areas on each substrate begins.

12. The exposure method of claim 9, further comprising:
a judgment process in which a fluctuation amount of said wavefront aberration predicted is judged whether it exceeds a predetermined value or not; wherein
in said wavefront aberration correction process, said wavefront correction is performed when it is judged that said fluctuation amount has exceeded a predetermined value.

13. The exposure method of claim 12, wherein
in said prediction process, a fluctuation amount of wavefront aberration occurring when exposing a plurality of divided areas on said predetermined number of substrates in the next exposure is predicted, based on a result of said wavefront measurement each time said wavefront measurement is performed,
in said judgment process, a fluctuation amount of wavefront aberration from before exposure performed previously on divided areas a predetermined numbers earlier begins is judged whether it exceeds a predetermined value or not, each time before exposure of said predetermined number of divided areas on each substrate begins, and
in said wavefront aberration correction process, said wavefront correction is performed based on a result of said prediction before exposure of the next predetermined number of divided areas begins, when said fluctuation amount is judged to be exceeding a predetermined value.

14. A device manufacturing method including a lithographic process, wherein in the lithographic process exposure is performed using the exposure method in claim 9.

15. An exposure method in which a mask where a pattern is formed is illuminated with an illumination light and said pattern is sequentially transferred onto a plurality of substrates via a projection optical system, said exposure method comprising:
a wavefront aberration measurement process m which wavefront aberration of said projection optical system is measured each time before exposure of a predetermined number of substrates begins;
a prediction process in which a fluctuation amount of wavefront aberration occurring when exposing a plurality of divided areas on said predetermined number of substrates in the next exposure is predicted, based on a result of said wavefront measurement; and
a wavefront aberration correction process in which wavefront correction is performed that corrects said wavefront aberration based on a result of said prediction.

16. The exposure method of claim 15, further comprising:
a judgment process in which a fluctuation amount of wavefront aberration from the previous wavefront measurement is judged whether it exceeds a predetermined value or not, when said wavefront measurement is performed; and in said wavefront aberration correction process, said wavefront correction is performed when it is judged that said fluctuation amount has exceeded a predetermined value.

17. The exposure method of claim 15 wherein said predetermined number of substrates is in plurals, and in said prediction process, a fluctuation amount of wavefront aberration that occurs when exposing a plurality of divided areas on said plurality of substrates is predicted.

18. A device manufacturing method including a lithographic process, wherein in the lithographic process exposure is performed using the exposure method in claim 15.

19. An exposure apparatus that illuminates a mask on which a pattern is formed with an illumination light from an illumination system and transfers said pattern onto a substrate via a projection optical system, said exposure apparatus comprising:

a first control unit configured to perform wavefront measurement in which wavefront aberration of said projection optical system is measured using a wavefront aberration measurement instrument before said pattern is sequentially transferred onto a predetermined number of divided areas on a predetermined number of substrates;

a correction mechanism that is provided to said projection optical system, and corrects wavefront aberration of said projection optical system; and a second control unit configured to predict a fluctuation amount of wavefront aberration that occurs when exposing said predetermined number of divided areas in the next exposure based on results of said wavefront measurement, and based on said fluctuation amount that is predicted, corrects wavefront of said projection optical system by controlling said correction mechanism.

20. The exposure apparatus of claim 19, further comprising:

a judgment unit that is connected to said second control unit, and judges whether a fluctuation amount of wavefront aberration from a previous measurement exceeds a predetermined value when said wavefront measurement is performed; wherein said second control unit corrects wavefront of said projection optical system when said judgment unit judges that said amount of fluctuation has exceeded a predetermined value.

21. The exposure apparatus of claim 19, further comprising:

a first stage that moves holding said mask; and a second stage that moves holding said wavefront measurement instrument.

22. An exposure apparatus that illuminates a mask on which a pattern is formed with an exposure illumination light from an illumination system and transfers said pattern onto a substrate via a projection optical system, said exposure apparatus comprising:

a first control unit configured to measure wavefront aberration of said projection optical system using a wavefront aberration measurement instrument;

a correction mechanism that is provided to said projection optical system, and corrects wavefront aberration of said projection optical system;

a judgment unit configured to judge whether a fluctuation amount of wavefront aberration from a previous measurement exceeds a predetermined value when said wavefront measurement is performed; and a second control unit that is connected to said judgment unit, and corrects wavefront of said projection optical system by controlling said correction mechanism when said judgment unit judges that said amount of fluctuation has exceeded a predetermined value.

23. The exposure apparatus of claim 21, wherein said first stage is mounted at a position different from a position where said mask is held, and has a pattern plate on which at least one pinhole shaped aperture pattern is formed, and said first control unit adjusts a position of at least one of said first stage and said second stage so that said wavefront measurement instrument is positioned at a projection position of said aperture pattern, irradiates said aperture pattern on said pattern plate with an illumination light from said illumination system, and performs wavefront measurement in which wavefront aberration of said projection optical system is measured using said wavefront measurement instrument.

24. The exposure apparatus of claim 22, further comprising:

a first stage that moves holding said mask;

a second stage to winch said wavefront measurement instrument is attached; and a pattern plate mounted on said first stage and at a position different from a position where said mask is held, on which at least one pinhole shaped aperture pattern is formed;

wherein said first control unit adjusts a position of at least one of said first stage and said second stage so that said wavefront measurement instrument is positioned at a projection position of said aperture pattern, irradiates said aperture pattern on said pattern plate with an exposure illumination light from said illumination system, and performs wavefront measurement in which wavefront aberration of said projection optical system is measured using said wavefront measurement instrument.

25. An exposure method in which a mask where a pattern is formed is illuminated with an exposure illumination light and said pattern is sequentially transferred onto a plurality of substrates via a projection optical system, said exposure method comprising:

a wavefront aberration measurement process in which wavefront aberration of said projection optical system is measured before exposure of a predetermined number of substrates begins;

a judgment process in which a fluctuation amount of wavefront aberration from the previous wavefront measurement is judged whether it exceeds a predetermined value or not, based on a result of said wavefront measurement; and a wavefront aberration correction process in which said wavefront correction is performed when it is judged that said fluctuation amount has exceeded a predetermined value.

* * * * *